(12) United States Patent  (10) Patent No.: US 8,184,671 B2
Mori  (45) Date of Patent: May 22, 2012

(54) SEMICONDUCTOR OPTICAL ELEMENT, SEMICONDUCTOR LASER USING THE SEMICONDUCTOR OPTICAL ELEMENT, AND OPTICAL TRANSPONDER USING THE SEMICONDUCTOR LASER

(75) Inventor: Hiroshi Mori, Kawasaki (JP)

(73) Assignee: Anritsu Corporation, Atsugi-Shi (JP)

( * ) Notice: Subject to any disclaimer, the term of this patent is extended or adjusted under 35 U.S.C. 154(b) by 1007 days.

(21) Appl. No.: 11/992,980

(22) PCT Filed: Oct. 9, 2007

(86) PCT No.: PCT/JP2007/069697
§ 371 (c)(1),
(2), (4) Date: Apr. 2, 2008

(87) PCT Pub. No.: WO2008/053672
PCT Pub. Date: May 8, 2008

(65) Prior Publication Data
US 2010/0150579 A1 Jun. 17, 2010

(30) Foreign Application Priority Data
Oct. 31, 2006 (JP) .................................. 2006-295482

(51) Int. Cl.
*H01S 5/00* (2006.01)
*H01S 3/10* (2006.01)
(52) U.S. Cl. .................... 372/46.01; 372/20; 372/43.01; 372/45.01
(58) Field of Classification Search ............... 372/45.01, 372/20, 43.01, 46.01
See application file for complete search history.

(56) References Cited

U.S. PATENT DOCUMENTS
5,568,311 A 10/1996 Matsumoto
(Continued)

FOREIGN PATENT DOCUMENTS
JP 07-326820 A 12/1995
(Continued)

OTHER PUBLICATIONS
International Preliminary Report on Patentability and Written Opinion of the International Searching Authority dated May 14, 2009 (8 pages), issued in counterpart International application No. PCT/JP2007/069697.
An English translation of the International Search Report dated Jan. 22, 2008, issued in a counterpart International Application.

*Primary Examiner* — Jessica Stultz
*Assistant Examiner* — Phillip Nguyen
(74) *Attorney, Agent, or Firm* — Holtz, Holtz, Goodman & Chick, PC

(57) ABSTRACT

A semiconductor optical element includes an n-type substrate, an n-type clad layer formed upward of the n-type substrate, a p-type clad layer formed upward of the n-type substrate, a guide layer, formed between the p-type clad layer and the n-type clad layer, for waveguiding a light, first and second electrodes respectively formed on the bottom surface of the n-type substrate and the upper surface of the p-type clad layer, and a plurality of electric current regulating members provided in the vicinity of the guide layer and regularly arranged along a light waveguide direction in the guide layer. The plurality of electric current regulating members generate an even distribution of a refractive index in the guide layer along the light waveguide direction in the guide layer. The guide layer reflects light with a wavelength which is determined in accordance with the even refractive index distribution.

18 Claims, 11 Drawing Sheets

U.S. PATENT DOCUMENTS

| | | | |
|---|---|---|---|
| 5,581,572 A * | 12/1996 | Delorme et al. | 372/50.11 |
| 6,643,309 B1 | 11/2003 | Gotoda | |
| 6,693,937 B2 | 2/2004 | Steffens | |
| 7,106,778 B2 * | 9/2006 | Reid et al. | 372/96 |
| 7,145,923 B2 * | 12/2006 | Carter et al. | 372/20 |
| 2003/0039285 A1 * | 2/2003 | Yatsu et al. | 372/45 |
| 2004/0264533 A1 * | 12/2004 | Matsumura et al. | 372/45 |
| 2008/0095538 A1 * | 4/2008 | Granot et al. | 398/161 |
| 2009/0310630 A1 * | 12/2009 | Takabayashi | 372/20 |

FOREIGN PATENT DOCUMENTS

| | | |
|---|---|---|
| JP | 11-317564 A | 11/1999 |
| JP | 2002-217489 A | 8/2002 |
| JP | 2002-353556 A | 12/2002 |
| JP | 2004-537863 A | 12/2004 |
| WO | WO 02/03516 A1 | 1/2002 |
| WO | WO 03/012936 A2 | 2/2003 |

* cited by examiner

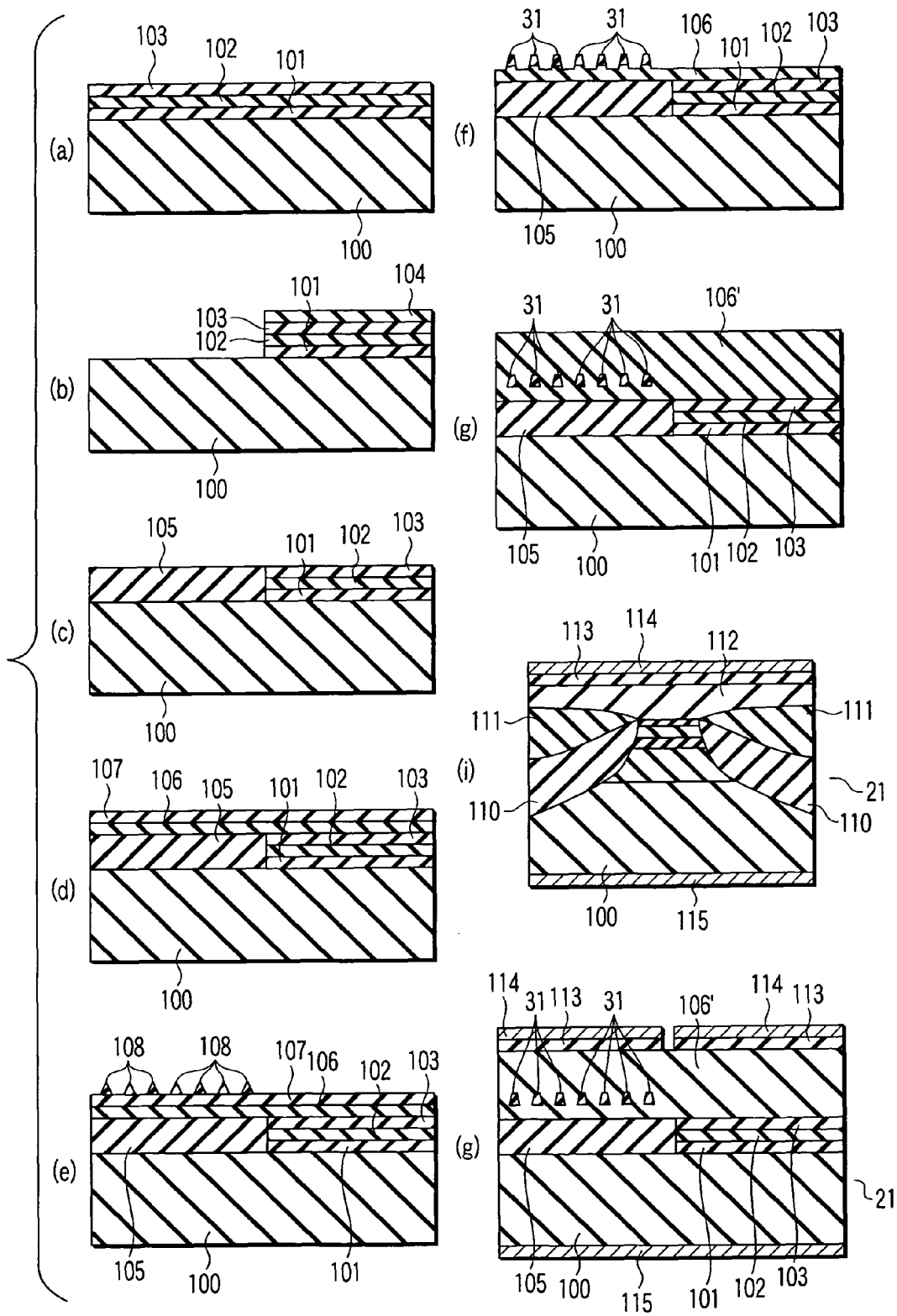
F I G. 11 ific Optical Element,
SEMICONDUCTOR OPTICAL ELEMENT, SEMICONDUCTOR LASER USING THE SEMICONDUCTOR OPTICAL ELEMENT, AND OPTICAL TRANSPONDER USING THE SEMICONDUCTOR LASER

TECHNICAL FIELD

This application is a U.S. National Phase Application under 35 USC 371 of International Application PCT/JP2007/069697 filed Oct. 9, 2007.

The present invention relates to a semiconductor optical element having a wavelength selectivity to a reflected wave and adopting a technique for realization of transition from a non-reflective state to a state in which only a light with a target wavelength is reflected with a high wavelength selectivity, a semiconductor laser using the semiconductor optical element, and an optical transponder using the semiconductor laser.

BACKGROUND ART

A semiconductor laser, which is used as a light source of an optical communication system and optical measurement system, generally has the following constitution: the semiconductor laser waveguides a light induced and emitted to a junction portion, which is obtained when injecting an electric current to a pn junction semiconductor, by a waveguide structure, and then reflects the light by an optical reflector formed in the waveguide ends to make the light travel reciprocatingly, and subsequently to selectively oscillate a light with a standing wavelength, which is determined in accordance with the length of the waveguide path between the optical reflectors and a refractive index of the inside of the waveguide path.

The semiconductor laser having the above constitution includes a multi-wavelength type without a wavelength selectivity, a fixed wavelength type which has the wavelength selectivity but has a fixed wavelength, and a variable wavelength type which has the wavelength selectivity and can vary the wavelength.

As the variable wavelength type semiconductor laser, there has been known a distributed Bragg reflector (DBR) type semiconductor laser.

FIG. 16 is a sectional side view showing an outline structure of a semiconductor laser 10 having the prior art DBR type optical reflector.

In this semiconductor laser 10, a guide layer 14 having an active layer 13 and a diffraction grating is provided between a p-type clad layer 11, which is formed of for example p-type indium phosphorus (p-InP), and an n-type substrate 12, which is formed of n-type indium phosphorus (n-InP), so as to be continued at a predetermined width and formed of indium gallium arsenic phosphorous (InGaAsP), for example.

In addition, in this semiconductor laser 10, a common electrode 15 is formed over almost the entire surface (element lower surface) of the n-type substrate 12, and a pair of individual electrodes 16 and 17 respectively facing the active layer 13 and the guide layer 14 is formed on the surface (element upper surface) of the p-type clad layer 11.

Note that in this semiconductor laser 10, the n-type substrate 12 in a position near the active layer 13 and guide layer 14 serves as an n-type clad layer 12a for preventing a light from leaking to the outer peripheral part with the p-type clad layer 11.

Moreover, in this semiconductor laser 10, a phase control region may be provided between the active layer 13 and the guide layer 14 in some cases.

Here, when a predetermined electric current Id is injected in between the common electrode 15 and the individual electrode 16, a light in a predetermined band is emitted in the active layer 13, and a part of this emitted light enters a DBR region forming the optical reflector.

Grooves 14a are formed on one surface side of the guide layer 14 at a predetermined interval Λ. In the incident light, an optical component with a wavelength $\lambda_B$ determined by the predetermined interval Λ is reflected on the active layer 13 side, while most of the other wavelength components is output from an end surface 10b side (referred to as Bragg reflection).

Therefore, the light with the wavelength $\lambda_B$ is selectively amplified between the element end surface 10a and the guide layer 14, and a part of the light is then output from the end surface 10a.

Here, when an equivalent refractive index of a waveguide path in the inside of the element is represented by n, there has been known that the wavelength $\lambda_B$ is represented by the equation:

$$\lambda_B = 2n\Lambda.$$

In addition, there has been known that the equivalent refractive index n is changed depending on a carrier density and temperature of the waveguide path.

An electric current Is injected in between the common electrode 15 and the individual electrode 17 is changed to change the carrier density and temperature of the guide layer 14 to thereby change the equivalent refractive index n of the waveguide path in the inside of the element, whereby it is possible to vary the oscillation wavelength $\lambda_B$.

However, the wavelength change width in a single mode obtained by the variable control in the electric current density and temperature with respect to the guide layer 14 is about 1 percent. When the significant wavelength change width is required, there is a problem that a plurality of semiconductor lasers 10 having the above constitution should be used.

As a technique for solving the above problem, Patent Document 1 describes a tunable laser having a sampled grating structure. In this tunable laser, DBR regions are provided on the front and rear sides of an active layer. The DBR region of the front side is formed such that an interval of a groove for diffraction is gradually changed, while the DBR region of the rear side has a lattice part which has a constant groove interval and is provided at a predetermined interval.

Patent Document 1: PCT international publication <WO 03/012936 A2> (corresponding to Japanese KOHYO Publication No. 2004-537863)

DISCLOSURE OF INVENTION

However, the above mentioned DBR type optical reflector used in the semiconductor laser has a system in which the groove 14a for diffraction is provided in the waveguide path to Bragg-reflect a light. Therefore, even in a state that the electric current is not applied, the optical reflector becomes a state in which a light with a wavelength, which is determined by the refractive index in that state and an interval of the groove, is reflected, whereby there is a problem that a non-reflective state cannot be realized in the case of using only the semiconductor optical reflector.

In addition, when the optical reflector gradually changing the interval of the diffraction groove as in the Patent Document 1 is used for changing the reflection wavelength, the reflection is generated in a plurality of wavelengths even in the state in which the electric current is not applied. Therefore, even when the electric current is injected into a certain electrode to realize a high reflectance to a light with a target wavelength, the reflectance to other wavelength is relatively large, whereby there is a problem that the wavelength selectivity is low.

Accordingly, when the DBR type optical reflector is used in the semiconductor laser, since the DBR region is required on the rear side of the active layer as in the Patent Document 1, the structure becomes complicated, and in addition, there is a problem that the spectrum purity of the output light is lowered.

An object of the invention is to provide a semiconductor optical element which can solve the above problems and can realize the transition from a non-reflective state to a state in which only a light with a target wavelength is reflected with a high wavelength selectivity, a semiconductor laser using the semiconductor optical element, and an optical transponder using the semiconductor laser.

In order to achieve the above-described object, according to a first aspect of the invention, there is provided a semiconductor optical element (20) comprising:

an n-type substrate (23);

an n-type clad layer (23a) formed in a part of the n-type substrate (23) itself or upward of the n-type substrate (23);

a p-type clad layer (22) formed upward of the n-type substrate (23);

a guide layer (24), formed between the p-type clad layer (22) and the n-type clad layer (23a), for waveguiding a light;

first and second electrodes (40, 41) respectively formed on a bottom surface of the n-type substrate (23) and an upper surface of the p-type clad layer (22); and a plurality of electric current regulating members (31) provided in the vicinity of the guide layer (24) and regularly arranged along a light waveguide direction of the guide layer (24), wherein the plurality of electric current regulating members (31) show a refractive index approximately the same as a surrounding object, provides an even electric current density distribution in the guide layer (24) along the light waveguide direction in the guide layer (24) in a state in which the electric current has been injected in between the first and second electrodes (40, 41), and generates an even distribution of the refractive index in the guide layer (24) along the light waveguide direction in the guide layer (24) based on the even electric current density distribution, whereby the guide layer (24) reflects a light with a wavelength, which is determined in accordance with the even refractive index distribution, of incident lights.

In order to achieve the above-described object, according to a second aspect of the invention, there is provided the semiconductor optical element (20) according to the first aspect, wherein the plurality of electric current regulating members (31) are formed inside at least one of the p-type clad layer (22) and the n-type clad layer (23a).

In order to achieve the above-described object, according to a third aspect of the invention, there is provided the semiconductor optical element (20) according to the second aspect, wherein the plurality of electric current regulating members (31) have a conductivity type opposite to that of the surrounding clad layer (22, 23a).

In order to achieve the above-described object, according to a fourth aspect of the invention, there is provided the semiconductor optical element (20) according to the first aspect, wherein the plurality of electric current regulating members (31) are formed of a high-resistance material.

In order to achieve the above-described object, according to a fifth aspect of the invention, there is provided the semiconductor optical element (20) according to the first aspect, wherein one of the first and second electrodes (40, 41) is formed as a common electrode (40) and another one is formed as a plurality of individual electrodes (41A, 41B, 41C).

In order to achieve the above-described object, according to a sixth aspect of the invention, there is provided the semiconductor optical element (20) according to the fifth aspect, wherein the plurality of electric current regulating members (31) are formed as a plurality of electric current block groups (30A, 30B, 30C) having respectively predetermined intervals ($\Lambda 1, \Lambda 2, \Lambda 3$) corresponding to each of the plurality of individual electrodes (41A, 41B, 41C), the plurality of electric current regulating members (31) show:

a first reflection property (F1) having a peak reflectance at a wavelength $\lambda_{B1}$ satisfying a Bragg reflection condition: $\lambda_{B1}=2n_1\Lambda 1$ (wherein, $n_1$ is an equivalent refractive index of a waveguide path) in a state in which an electric current has been injected into a first individual electrode (41A) corresponding to a first electric current block group (30A) of the predetermined interval $\Lambda 1$ in the plurality of electric current regulating members (31) and into the common electrode (40);

a second reflection property (F2) having the peak reflectance at a wavelength $\lambda_{B2}$ satisfying a Bragg reflection condition: $\lambda_{B2}=2n_2\Lambda 2$ (wherein, $n_2$ is the equivalent refractive index of the waveguide path) in a state in which an electric current has been injected into a second individual electrode (41B) corresponding to a second electric current block group (30B) of the predetermined interval $\Lambda 2$ in the plurality of electric current regulating members (31) and into the common electrode (40); and a third reflection property (F3) having the peak reflectance at a wavelength $\lambda_{B3}$ satisfying a Bragg reflection condition: $\lambda_{B3}=2n_3\Lambda_3$ (wherein, $n_3$ is the equivalent refractive index of the waveguide path) in a state in which an electric current has been injected into a third individual electrode (41C) corresponding to a third electric current block group (30C) having the predetermined interval $\Lambda 3$ in the plurality of electric current regulating members (31) and into the common electrode (40), and at least two of the first, second, and third reflection properties (F1, F2, F3) can be selected by an arbitrary combination thereof.

In order to achieve the above-described object, according to a seventh aspect of the invention, there is provided the semiconductor optical element (20) according to the first aspect, wherein at least one of the interval of the plurality of electric current regulating members (31) and a width of the guide layer (24) is formed so as to regularly vary along the light waveguide direction of the guide layer (24), and one of the first and second electrodes (40, 41) is formed as a common electrode (40) so as to selectively inject the electric current in each region where the interval of the plurality of electric current regulating members (31) or the width of the guide layer (24) is regularly changed, and another electrode is formed as a plurality of individual electrodes ($41_1, 41_2, 41_3, \ldots, 41_{N-1}, 41_N$).

In order to achieve the above-described object, according to an eighth aspect of the invention, there is provided the semiconductor optical element (20) according to the first aspect, further comprising a heating element (51) to vary a temperature of the guide layer (24).

In order to achieve the above-described object, according to a ninth aspect of the invention, there is provided a semiconductor laser (60) in which an active layer (61) to induce and emit a light is formed between a p-type clad layer (22) and an n-type clad layer (23a), a semiconductor optical reflector (20) having a wavelength selectivity and reflecting a light is provided at least one end side of the active layer (61), the semiconductor laser (60) selectively oscillating the light which has been induced and emitted in the active layer (61) and has a wavelength reflected by the semiconductor optical reflector (20), wherein the semiconductor optical reflector (20) comprises:

an n-type substrate (23);

an n-type clad layer (23a) formed in a part of the n-type substrate (23) itself or upward of the n-type substrate (23);

a p-type clad layer (22) formed upward of the n-type substrate (23);

a guide layer (24), formed between the p-type clad layer (22) and the n-type clad layer (23a), for waveguiding a light;

first and second electrodes (40, 41) respectively formed on a bottom surface of the n-type substrate (23) and an upper surface of the p-type clad layer (22); and a plurality of electric current regulating members (31) provided in the vicinity of the guide layer (24) and regularly arranged along a light waveguide direction of the guide layer (24), and the plurality of electric current regulating members (31) show a refractive index approximately the same as a surrounding object, provide an even electric current density distribution in the guide layer (24) along the light waveguide direction in the guide layer (24) in a state in which the electric current has been injected in between the first and second electrodes (40, 41), and generate an even distribution of the refractive index in the guide layer (24) along the light waveguide direction in the guide layer (24) based on the even electric current density distribution, whereby the guide layer (24) reflects a light with a wavelength, which is determined in accordance with the even refractive index distribution, of incident lights.

In order to achieve the above-described object, according to a tenth aspect of the invention, there is provided the semiconductor laser (60) according to the ninth aspect, wherein the plurality of electric current regulating members (31) of the semiconductor optical reflector (20) are formed inside at least one of the p-type clad layer (22) and the n-type clad layer (23a).

In order to achieve the above-described object, according to an eleventh aspect of the invention, there is provided the semiconductor laser (60) according to the tenth aspect, wherein the plurality of electric current regulating members (31) of the semiconductor optical reflector (20) have a conductivity type opposite to that of the surrounding clad layer (22, 23a).

In order to achieve the above-described object, according to a twelfth aspect of the invention, there is provided the semiconductor laser (60) according to the ninth aspect, wherein the plurality of electric current regulating members (31) of the semiconductor optical reflector (20) are formed of a high-resistance material.

In order to achieve the above-described object, according to a thirteenth aspect of the invention, there is provided the semiconductor laser (60) according to the ninth aspect, wherein one of the first and second electrodes (40, 41) of the semiconductor optical reflector (20) is formed as a common electrode (40) and another one is formed as a plurality of individual electrodes (41A, 41B, 41C).

In order to achieve the above-described object, according to a fourteenth aspect of the invention, there is provided the semiconductor laser (60) according to the thirteenth aspect, wherein the plurality of electric current regulating members (31) of the semiconductor optical reflector (20) are formed as a plurality of electric current block groups (30A, 30B, 30C) having respectively predetermined intervals (Λ1, Λ2, Λ3) corresponding to each of the plurality of individual electrodes (41A, 41B, 41C), the plurality of electric current regulating members (31) show:

a first reflection property (F1) having a peak reflectance at a wavelength $\lambda_{B1}$ satisfying a Bragg reflection condition: $\lambda_{B1}=2n_1\Lambda 1$ (wherein, $n_1$ is an equivalent refractive index of a waveguide path) in a state in which an electric current has been injected into a first individual electrode (41A) corresponding to a first electric current block group (30A) of the predetermined interval Λ1 in the plurality of electric current regulating members (31) and into the common electrode (40);

a second reflection property (F2) having the peak reflectance at a wavelength $\lambda_{B2}$ satisfying a Bragg reflection condition: $\lambda_{B2}=2n_2\Lambda 2$ (wherein, $n_2$ is the equivalent refractive index of the waveguide path) in a state in which an electric current has been injected into a second individual electrode (41B) corresponding to a second electric current block group (30B) of the predetermined interval Λ2 in the plurality of electric current regulating members (31) and into the common electrode (40); and a third reflection property (F3) having the peak reflectance at a wavelength $\lambda_{B3}$ satisfying a Bragg reflection condition: $\lambda_{B3}=2n_3\Lambda_3$ (wherein, $n_3$ is the equivalent refractive index of the waveguide path) in a state in which an electric current has been injected into a third individual electrode (41C) corresponding to a third electric current block group (30C) of the predetermined interval Λ3 in the plurality of electric current regulating members (31) and into the common electrode (40), and at least two of the first, second, and third reflection properties (F1, F2, F3) can be selected by an arbitrary combination thereof.

In order to achieve the above-described object, according to a fifteenth aspect of the invention, there is provided the semiconductor laser (60) according to the ninth aspect, wherein at least one of the interval of the plurality of electric current regulating members (31) of the semiconductor optical reflector (20) and a width of the guide layer (24) is formed so as to regularly vary along the light waveguide direction of the guide layer (24), and one of the first and second electrodes (40, 41) is formed as a common electrode (40) so as to selectively inject the electric current in each region where the interval of the plurality of electric current regulating members (31) or the width of the guide layer (24) is regularly changed, and the other electrode is formed as a plurality of individual electrodes ($41_1$, $41_2$, $41_3$, ..., $41_{N-1}$, $41_N$).

In order to achieve the above-described object, according to a sixteenth aspect of the invention, there is provided the semiconductor laser (60) according to the ninth aspect, wherein the semiconductor optical reflector (20) comprises a heating element (51) to vary a temperature of the guide layer (24).

In order to achieve the above-described object, according to a seventeenth aspect of the invention, there is provided an optical transponder (90) comprising:

a transmission section (91) which modulates an output light of a wavelength variable type semiconductor laser (60) by an electrical signal to output the modulated light; and a receiving section (95) which converts an incident light into an electrical signal, and outputs the electrical signal, wherein in the semiconductor laser (60) of the transmission section (91), an active layer (61) for inducing and emitting a light is formed between a p-type clad layer (22) and an n-type clad layer (23a), a semiconductor optical reflector (20) having a wavelength selectivity and reflecting a light is provided at least one end side of the active layer (61), the semiconductor laser (60) selectively oscillating the light which has been induced and emitted in the active layer (61) and has a wavelength reflected by the semiconductor optical reflector (20), the semiconductor optical reflector (20) of the semiconductor laser (60) comprises:

an n-type substrate (23);

an n-type clad layer (23a) formed in a part of the n-type substrate (23) itself or upward of the n-type substrate (23);

a p-type clad layer (22) formed upward of the n-type substrate (23);

a guide layer (24), formed between the p-type clad layer (22) and the n-type clad layer (23a), for waveguiding a light;

first and second electrodes (40, 41) respectively formed on a bottom surface of the n-type substrate (23) and an upper surface of the p-type clad layer (22); and a plurality of electric current regulating members (31) provided in the vicinity of the guide layer (24) and regularly arranged along a light waveguide direction of the guide layer (24), and the plurality of electric current regulating members (31) show a refractive index approximately the same as a surrounding object, provide an even electric current density distribution in the guide layer (24) along the light waveguide direction in the guide layer (24) in a state in which the electric current has been injected in between the first and second electrodes (40, 41), and generate an even distribution of the refractive index in the guide layer (24) along the light waveguide direction in the guide layer (24) based on the even electric current density distribution, whereby the guide layer (24) reflects a light with a wavelength, which is determined in accordance with the even refractive index distribution, of incident lights.

In order to achieve the above-described object, according to an eighteenth aspect of the invention, there is provided the optical transponder (90) according to the seventeenth aspect, wherein the plurality of electric current regulating members (31) of the semiconductor optical reflector (20) of the semiconductor laser (60) are formed inside at least one of the p-type clad layer (22) and the n-type clad layer (23a).

In order to achieve the above-described object, according to a nineteenth aspect of the invention, there is provided the optical transponder (90) according to the eighteenth aspect, wherein the plurality of electric current regulating members (31) of the semiconductor optical reflector (20) of the semiconductor laser (60) have a conductivity type opposite to that of the surrounding clad layer (22, 23a).

In order to achieve the above-described object, according to a twentieth aspect of the invention, there is provided the optical transponder (90) according to the seventeenth aspect, wherein the plurality of electric current regulating members (31) of the semiconductor optical reflector (20) of the semiconductor laser (60) are formed of a high-resistance material.

In order to achieve the above-described object, according to a twenty-first aspect of the invention, there is provided the optical transponder (90) according to the seventeenth aspect, wherein one of the first and second electrodes (40, 41) of the semiconductor optical reflector (20) of the semiconductor laser (60) is formed as a common electrode (40) and another one is formed as a plurality of individual electrodes (41A, 41B, 41C).

In order to achieve the above-described object, according to a twenty-second aspect of the invention, there is provided the optical transponder (90) according to the twenty-first aspect, wherein the plurality of electric current regulating members (31) of the semiconductor optical reflector (20) of the semiconductor laser (60) are formed as a plurality of electric current block groups (30A, 30B, 30C) having respectively predetermined intervals ($\Lambda 1, \Lambda 2, \Lambda 3$) corresponding to each of the plurality of individual electrodes (41A, 41B, 41C), the plurality of electric current regulating members (31) show:

a first reflection property (F1) having a peak reflectance at a wavelength $\lambda_{B1}$ satisfying a Bragg reflection condition: $\lambda_{B1}=2n_1\Lambda 1$ (wherein, $n_1$ is an equivalent refractive index of a waveguide path) in a state in which an electric current has been injected into a first individual electrode (41A) corresponding to a first electric current block group (30A) having the predetermined interval $\Lambda 1$ in the plurality of electric current regulating members (31) and into the common electrode (40);

a second reflection property (F2) having the peak reflectance at a wavelength $\lambda_{B2}$ satisfying a Bragg reflection condition: $\lambda_{B2}=2n_2\Lambda 2$ (wherein, $n_2$ is the equivalent refractive index of the waveguide path) in a state in which an electric current has been injected into a second individual electrode (41B) corresponding to a second electric current block group (30B) having the predetermined interval $\Lambda 2$ in the plurality of electric current regulating members (31) and into the common electrode (40); and a third reflection property (F3) having the peak reflectance at a wavelength $\lambda_{B3}$ satisfying a Bragg reflection condition: $\lambda_{B3}=2n_3\Lambda_3$ (wherein, $n_3$ is the equivalent refractive index of the waveguide path) in a state in which an electric current has been injected into a third individual electrode (41C) corresponding to a third electric current block group (30C) having the predetermined interval $\Lambda 3$ in the plurality of electric current regulating members (31) and into the common electrode (40), and at least two of the first, second, and third reflection properties (F1, F2, F3) can be selected by an arbitrary combination thereof.

In order to achieve the above-described object, according to a twenty-third aspect of the invention, there is provided the optical transponder (90) according to the seventeenth aspect, wherein at least one of the interval of the plurality of electric current regulating members (31) of the semiconductor optical reflector (20) of the semiconductor laser (60) and a width of the guide layer (24) is formed so as to regularly vary along the light waveguide direction of the guide layer (24), and one of the first and second electrodes (40, 41) is formed as a common electrode (40) so as to selectively inject the electric current in each region where the interval of the plurality of electric current regulating members (31) or the width of the guide layer (24) is regularly changed, and another electrode is formed as a plurality of individual electrodes ($41_1, 41_2, 41_3, \ldots, 41_{N-1}, 41_N$).

In order to achieve the above-described object, according to a twenty-fourth aspect of the invention, there is provided the optical transponder (90) according to the seventeenth aspect, wherein the semiconductor optical reflector (20) of the semiconductor laser (60) comprises a heating element (51) to vary a temperature of the guide layer (24).

In the semiconductor optical element of the invention constituted as above, there are the plurality of electric current regulating members having a refractive index approximately the same as the surrounding object and formed to have an electric current regulating action in which the electric current is less likely to flow compared to the surrounding part in an electric current injection state. Since the plurality of electric current regulating members are regularly arranged along the light waveguide direction in the guide layer, the plurality of electric current regulating members provide an even electric current density distribution along the light waveguide direction in the guide layer when the electric current is injected, and besides generate an even distribution of the refractive index in the guide layer along the light waveguide direction in the guide layer based on the even electric current density distribution. As a result, only a light with a wavelength, which is determined from among the lights entering from the guide layer in accordance with the even refractive index distribution, can be selectively reflected with a high efficiency.

In addition, in the semiconductor optical element of the invention, the plurality of electric current regulating members are formed inside at least one of the p-type clad layer and the n-type clad layer. Further, the plurality of electric current regulating members have a conductivity type opposite to that of the surrounding clad layer. Therefore, the electric current regulating action to make the electric current less likely to flow by forming a pn junction can be provided to the plurality of electric current regulating members.

Moreover, in the semiconductor optical element of the invention, it is possible to make the plurality of electric current regulating members be a high-resistance material preventing the formation of the pn junction. In that case, the plurality of electric current regulating members can be formed also in another layer provided between the clad layer and the guide layer.

Further, in the semiconductor optical element of the invention, one electrode of the first and second electrodes is formed as the common electrode, while another electrode is formed as the plurality of individual electrodes. The plurality of electric current regulating members are formed as the plurality of electric current block groups which respectively correspond to the plurality of individual electrodes and have the respective predetermined intervals. The plurality of electric current regulating members show first, second and third reflection properties (F1, F2 and F3). The first reflection property (F1) has a peak reflectance at a wavelength $\lambda_{B1}$ satisfying a Bragg reflection condition: $\lambda_{B1}=2n_1\Lambda 1$ (wherein, $n_1$ is an equivalent refractive index of a waveguide path) in a state in which an electric current has been injected into the first individual electrode corresponding to the first electric current block group having a predetermined interval $\Lambda 1$ in the plurality of electric current regulating members and into the common electrode. The second reflection property (F2) has the peak reflectance at a wavelength $\lambda_{B2}$ satisfying a Bragg reflection condition: $\lambda_{B2}=2n_2\Lambda 2$ (wherein, $n_2$ is the equivalent refractive index of the waveguide path) in a state in which an electric current has been injected into the second individual electrode corresponding to the second electric current block group having a predetermined interval $\Lambda 2$ in the plurality of electric current regulating members and into the common electrode. The third reflection property (F3) has the peak reflectance at a wavelength $\lambda_{B3}$ satisfying a Bragg reflection condition: $\lambda_{B3}=2n_3\Lambda_3$ (wherein, $n_3$ is the equivalent refractive index of the waveguide path) in a state in which an electric current has been injected into the third individual electrode corresponding to the third electric current block group having a predetermined interval $\Lambda 3$ in the plurality of electric current regulating members and into the common electrode. At least two of the first, second, and third reflection properties (F1, F2 and F3) can be selected by an arbitrary combination thereof.

Further, in the semiconductor optical element of the invention, the interval of the plurality of electric current regulating members or the width of the guide layer is formed so as to be regularly changed along the light waveguide direction of the guide layer, and at the same time, an electrode structure, in which the electric current can be selectively injected in each region where the interval and the width are regularly changed, is realized. As a result, by controlling the electric current injected into the electrode, it is possible to easily change the reflection wavelength in a stepwise or continuous manner.

Further, in the invention, the semiconductor laser using the semiconductor optical reflector as the above-mentioned semiconductor optical element and the optical transponder using the semiconductor laser can output a light having a wavelength different from each other with a high spectral purity in a simple structure.

BRIEF DESCRIPTION OF DRAWINGS

FIG. 11 is a process view for explaining a method of manufacturing a basic structure of the semiconductor laser (60) according to the second embodiment of the invention.

BEST MODE FOR CARRYING OUT THE INVENTION

Figure 1A:
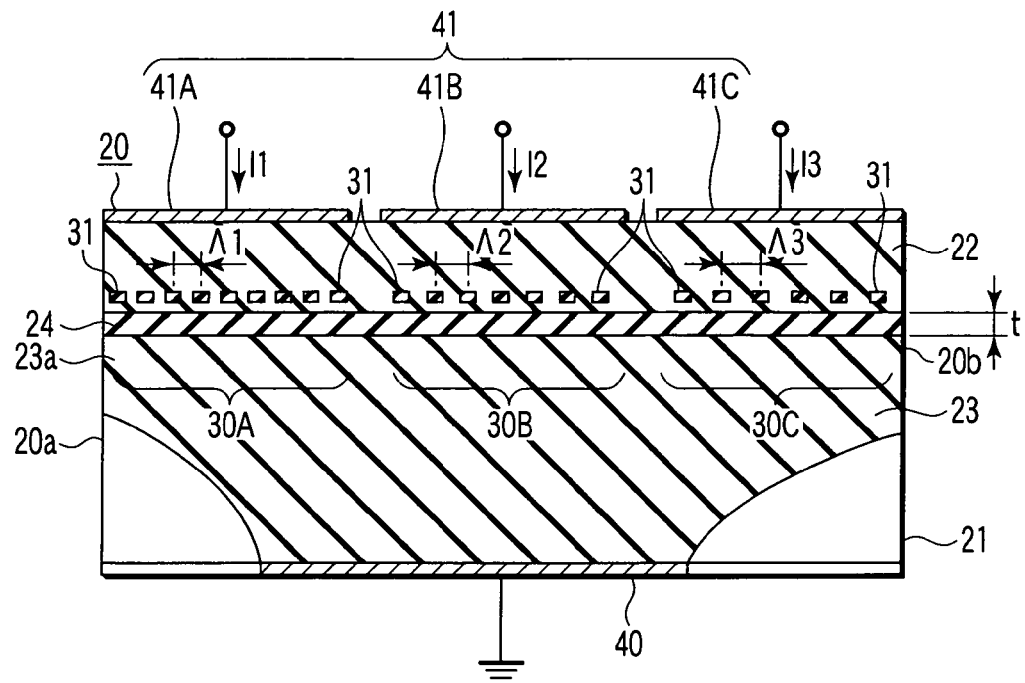
FIG. 1A is a sectional side view for explaining a structure of a semiconductor optical reflector (20) as a semiconductor optical element according to a first embodiment of the invention.

Hereinafter, based on the drawings, the description will be given to a semiconductor optical reflector 20 as a semiconductor optical element according to a first embodiment of the invention, a semiconductor laser 60 according to second to fifth embodiments of the invention, and an optical transponder 90 according to a sixth embodiment of the invention.

(First Embodiment)

First, the semiconductor optical reflector 20 as a semiconductor optical element according to the first embodiment of the invention will be explained with reference to FIGS. 1A to 3.

A basic structure of this semiconductor optical element has an n-type substrate 23, an n-type clad layer 23a formed in a part of the n-type substrate 23 itself or upward of the n-type substrate 23, a p-type clad layer 22 formed upward of the n-type substrate 23, a guide layer 24 which is formed between the p-type clad layer 22 and the n-type clad layer 23a and used for waveguiding a light, first and second electrodes 40 and 41 respectively formed on the bottom surface of the n-type substrate 23 and the upper surface of the p-type clad layer 22, and a plurality of electric current regulating members 31 which are provided in the vicinity of the guide layer 24 and regularly arranged along a light waveguide direction in the guide layer 24. The plurality of electric current regulating members 31 are characterized by showing a refractive index approximately the same as the surrounding object, providing an even electric current density distribution in the guide layer 24 along the light waveguide direction in the guide layer 24 in a state in which the electric current is injected in between the first and second electrodes 40 and 41, and generating an even distribution of the refractive index in the guide layer 24 along the light waveguide direction in the guide layer 24 based on the even electric current density distribution, whereby the guide layer 24 reflects a light with a wavelength, which is determined in accordance with the even refractive index distribution, of the incident lights.

Figure 2:
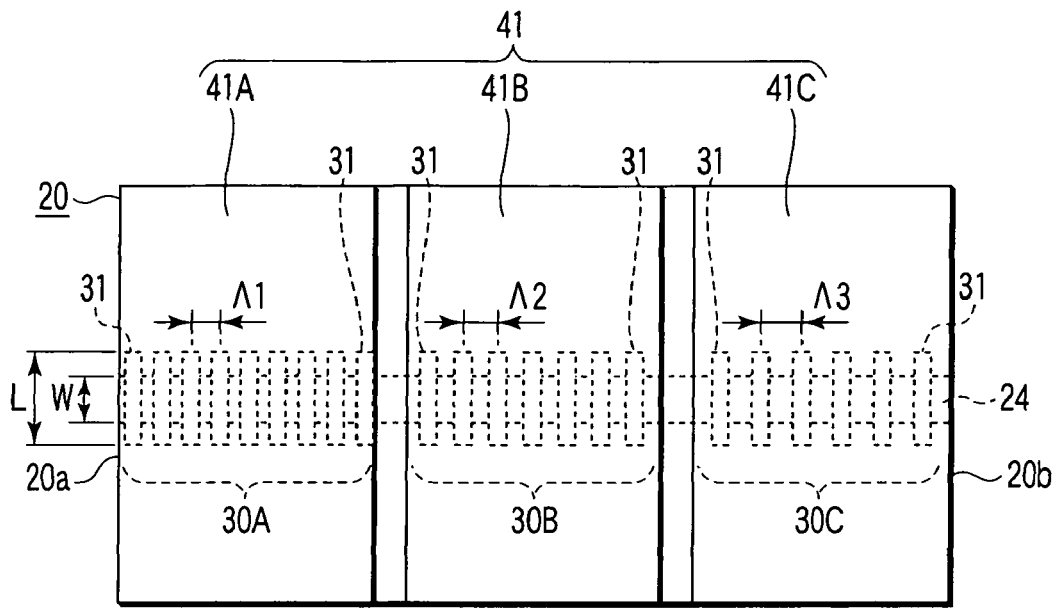
FIG. 2 is a plan view for explaining the structure of the semiconductor optical reflector (20) according to the first embodiment of the invention.
Figure 3:
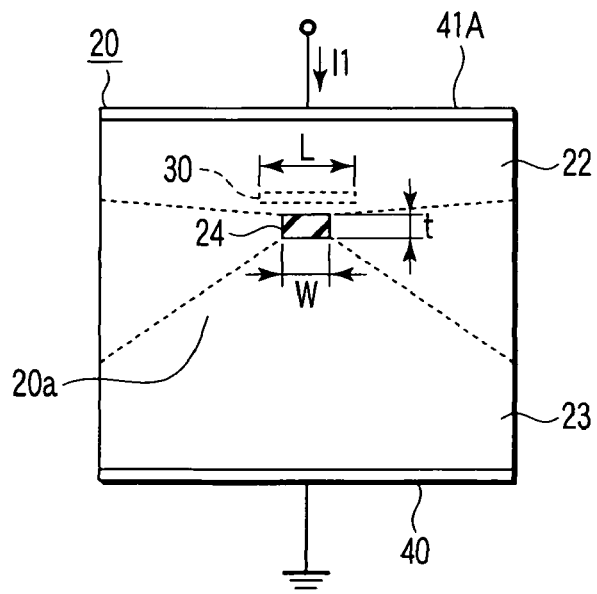
FIG. 3 is a front view for explaining the structure of the semiconductor optical reflector (20) according to the first embodiment of the invention.

Specifically, as shown in FIGS. 1A, 2 and 3, the semiconductor optical reflector 20 as the semiconductor optical element according to the first embodiment of the invention is formed on an epitaxial wafer 21 having the p-type clad layer 22 formed of for example p-type indium phosphorus (p-InP), the n-type substrate 23 formed of n-type indium phosphorus (n-InP) and the guide layer 24 which is sandwiched between the p-type clad layer 22 and the n-type substrate 23 and has a predetermined width W and a thickness t.

Note that the upper layer portion of the n-type substrate 23 serves as the n-type clad layer 23a. The n-type clad layer 23a and the p-type clad layer 22 prevent a light from leaking out to outside.

Namely, FIG. 1A shows an example in which the n-type clad layer 23a is formed in a part of the n-type substrate 23 itself.

Figure 1B:
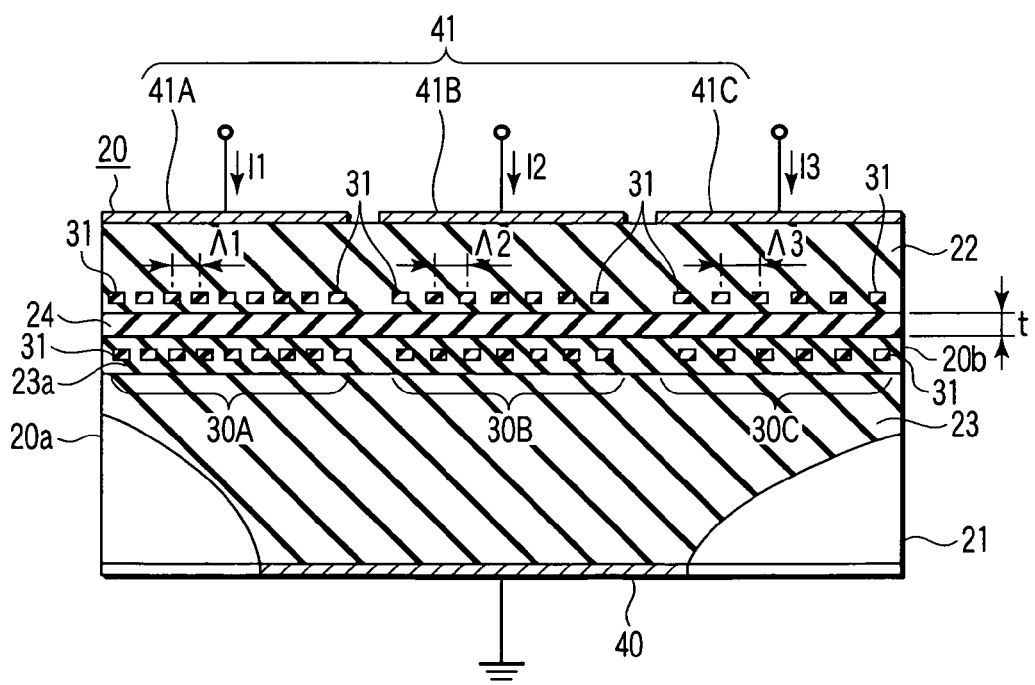
FIG. 1B is a sectional side view for explaining a structure of a modification of the semiconductor optical reflector (20) according to the first embodiment of the invention.

Instead of this n-type clad layer 23a, an n-type clad layer 23a, which is shown in FIG. 1B to be described later and formed of n-type indium gallium arsenic phosphorous (n-InGaAsP) for example, may be provided upward of the n-type substrate 23.

Meanwhile, the reflectances of both end surfaces 21a and 21b of the epitaxial wafer 21 are assumed to be low level.

Here, the guide layer 24 is formed of, for example, indium gallium arsenic phosphorous (InGaAsP) so as to be continued at the predetermined width W, and a band gap is rendered smaller (the refractive index is larger) than a clad so as to provide a waveguide path for waveguiding a light.

The plurality of electric current regulating members 31 formed in flat rectangles with a predetermined length L are provided in the vicinity of the guide layer 24 in the inside of the p-type clad layer 22, and regularly arranged along the light waveguide direction in the guide layer 24 at predetermined intervals $\Lambda 1$, $\Lambda 2$ and $\Lambda 3$ in a direction crosswise to the guide layer 24.

In this embodiment, the plurality of electric current regulating members 31 are constituted of three electric current block groups 30A, 30B and 30C. The first electric current block group 30A is a portion where the plurality of electric current regulating members 31 are arranged at the predetermined interval $\Lambda 1$, the second electric current block group 30B is a portion where the plurality of electric current regulating members 31 are arranged at the predetermined interval $\Lambda 2$, and the third electric current block group 30C is a portion where the plurality of electric current regulating members 31 are arranged at the predetermined interval $\Lambda 3$.

Here, the number of the electric current block groups constituting the plurality of electric current regulating members 31 may not be three, but can be one or two, or four or more.

The plurality of electric current regulating members 31 constituted of the three electric current block groups 30A, 30B and 30C show the refractive index approximately the same as the surrounding object (in this case, the p-type clad layer 22) in an electric current non-injection state to the first and second electrodes 40 and 41 to be described later, and at the same time, are formed so as to have electric current regulating action in which the electric current is less likely to flow compared to the surrounding object (in this case, the p-type clad layer 22) in an electric current injection state.

Namely, the plurality of electric current regulating members 31 are formed of, for example, a material made of n-InP which forms a pn junction with the p-type clad layer 22 to suppress the flowing of the electric current, or a material which is made of Fe-doped i-InP and shows a higher electrical resistance than the p-type clad layer 22.

The first and second electrodes 40 and 41 are formed on the both surfaces of the epitaxial wafer 21, that is, on the bottom surface of the n-type substrate 23 and the upper surface of the p-type clad layer 22, respectively.

The common electrode 40 (hereinafter referred to as first electrode 40 in some cases) is formed over approximately the entirety of the lower surface side of the epitaxial wafer 21 (bottom surface side of the n-type substrate 23).

Meanwhile, first to third individual electrodes 41A, 41B and 41C (hereinafter referred to as second electrodes 41 in some cases) are provided on the upper surface side of the epitaxial wafer 21 (the upper surface side of the p-type clad layer 22) so as to respectively correspond to the first to third electric current block groups 30A, 30B and 30C, and separately formed to be able to independently inject the electric current into each of the electric current block groups 30A, 30B and 30C between the common electrode 40 and the individual electrodes.

In the semiconductor optical reflector 20 with the above constitution, when the electric current is not injected in between any of the first and second electrodes 40 and 41, that is, the common electrode 40 and the first to third individual electrodes 41A, 41B and 41C, the guide layer 24 becomes the light waveguide path having a constant refractive index, which is approximately the same as the refractive index of the surrounding object, from one end side to the other end side, whereby the guide layer 24 waveguides the light, which has entered from one side of the end surfaces 20a and 20b, to output the light to the other side.

In this case, the propagation loss in the guide layer 24 is approximately constant in the wavelength band determined by the width W, the thickness t, and the like of the guide layer 24.

Figure 4:
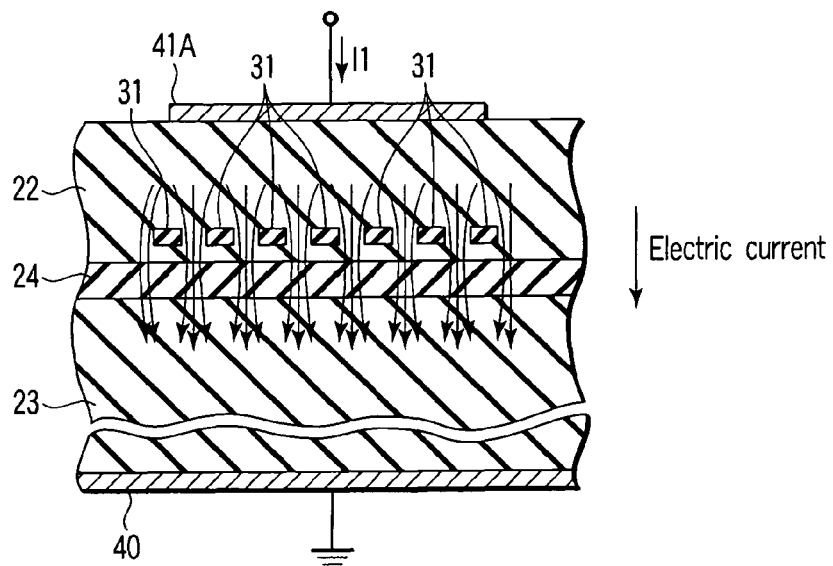
FIG. 4 is a sectional side view of a main part for explaining operation of the semiconductor optical reflector (20) according to the first embodiment of the invention.

Here, for instance, as shown in FIG. 4, when a predetermined electric current I1 is injected in between the common electrode 40 and the first individual electrode 41A, the injected electric current flowing from the p-type clad layer 22 to the guide layer 24 is concentrated at gaps of the first electric current block group 30A in the plurality of electric current regulating members 31 to flow therethrough.

Figure 5:
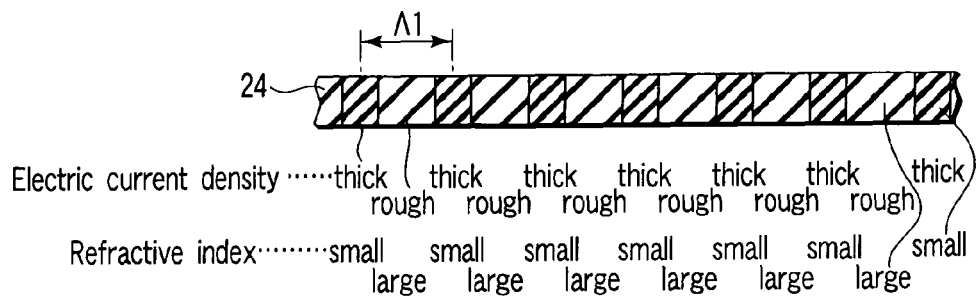
FIG. 5 is a relationship diagram between an electric current density and refractive index of a guide layer for explaining the operation of the semiconductor optical reflector (20) according to the first embodiment of the invention.

Therefore, as shown in FIG. 5, in the guide layer 24 at parts facing the first electric current block group 30A, a portion where the electric current density is rough and a portion where the electric current density is thick are alternately generated at an interval corresponding to the predetermined interval Λ1 of the plurality of electric current regulating members 31. The refractive index in the region where the electric current density is thick is rendered smaller than that in the region where the electric current density is rough by the plasma effect.

Namely, the regions having different refractive indexes are regularly generated in the guide layer 24 at the predetermined interval Λ1 of the plurality of electric current regulating members 31, whereby the reflection occurs with the wavelength $\lambda_{B1}$ satisfying the following Bragg reflection condition, in which lights reflected from the boundary portion where the refractive index is changed are enhanced to each other:

$\lambda_{B1}=2n_1\Lambda 1$ (wherein, $n_1$ is the equivalent refractive index of the waveguide path).

Namely, when the predetermined electric current I1 is injected in between the electrodes 40 and 41A of the semiconductor optical reflector 20, the guide layer 24 becomes a state to selectively reflect the light with the wavelength $\lambda_{B1}$ due to the first electric current block group 30A. At this time, when, for instance, a light containing the wavelength $\lambda_{B1}$ enters from the one end 20a side, only the light with the wavelength $\lambda_{B1}$ is reflected to return to the one end 20a, while other wavelength components pass through the semiconductor optical reflector 20 and, output from the other end 20b.

Figure 6:
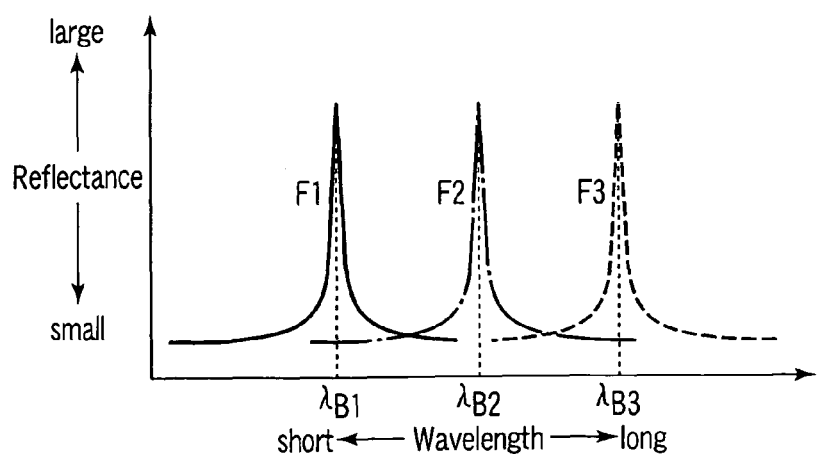
FIG. 6 is a reflection property view for explaining the operation of the semiconductor optical reflector (20) according to the first embodiment of the invention.

At this time, the semiconductor optical reflector 20 has a first reflection property F1 having a peak reflectance at the wavelength $\lambda_{B1}$, as shown in FIG. 6.

Meanwhile, when a predetermined electric current I2 is injected in between the electrodes 40 and 41B, the refractive index of the guide layer 24 is regularly increased at the predetermined interval Λ2 of the second electric current block group 30B of the plurality of electric current regulating members 31, and thus the reflection occurs with a wavelength $\lambda_{B2}$ satisfying the formula:

$\lambda_{B2}=2n_2\Lambda 2$ (wherein, $n_2$ is the equivalent refractive index of the waveguide path).

Therefore, when, for instance, a light containing the wavelength $\lambda_{B2}$ enters from the one end 20a side, only a light with the wavelength $\lambda_{B2}$ is reflected to return to the one end 20a, while other wavelength components pass through the semiconductor optical reflector 20 and, output from the other end 20b.

At this time, the semiconductor optical reflector 20 has a second reflection property F2 having the peak reflectance at the wavelength $\lambda_{B2}$, as shown in FIG. 6.

Meanwhile, when a predetermined electric current I3 is injected in between the electrodes 40 and 41C, the refractive index of the guide layer 24 is regularly increased at the predetermined interval Λ3 of the third electric current block group 30C of the plurality of electric current regulating members 31, and thus the reflection occurs with a wavelength $\lambda_{B3}$ satisfying the formula:

$\lambda_{B3}=2n_3\Lambda 3$ (wherein, $n_3$ is the equivalent refractive index of the waveguide path).

Therefore, when, for instance, a light containing the wavelength $\lambda_{B3}$ enters from the one end 20a side, only a light with the wavelength $\lambda_{B3}$ is reflected to return to the one end 20a, while other wavelength components pass through the semiconductor optical reflector 20 and, output from the other end 20b.

At this time, the semiconductor optical reflector 20 has a third reflection property F3 having the peak reflectance at the wavelength $\lambda_{B3}$, as shown in FIG. 6.

Therefore, the electric current is selectively injected in between any of the individual electrodes 41A, 41B and 41C and the common electrode 40, whereby the reflection property of the semiconductor optical reflector 20 can be selected to any one of the above mentioned three reflection properties F1, F2 and F3.

In this case, the electric current is injected in between an arbitrary plurality of the individual electrodes 41A, 41B and 41C (two in this case) and the common electrode 40 to thereby provide at the same time the electric current regulating action to an arbitrary plurality of the electric current regulating members 31 (two in this case) constituted of the plurality of electric current block groups 30A, 30B and 30C, whereby it is possible to provide at the same time an arbitrary combination of the plurality of reflection properties F1, F2 and F3 (two in this case).

Note that since the guide layer 24 in a portion where the electric current is not injected does not have the wavelength selectivity, this portion does not affect the reflection property in a part into which the electric current is injected.

In addition, as mentioned above, the reflection wavelength can be continuously varied by changing the electric current density and temperature of the guide layer 24 (waveguide path) to change the refractive index.

Figure 7:
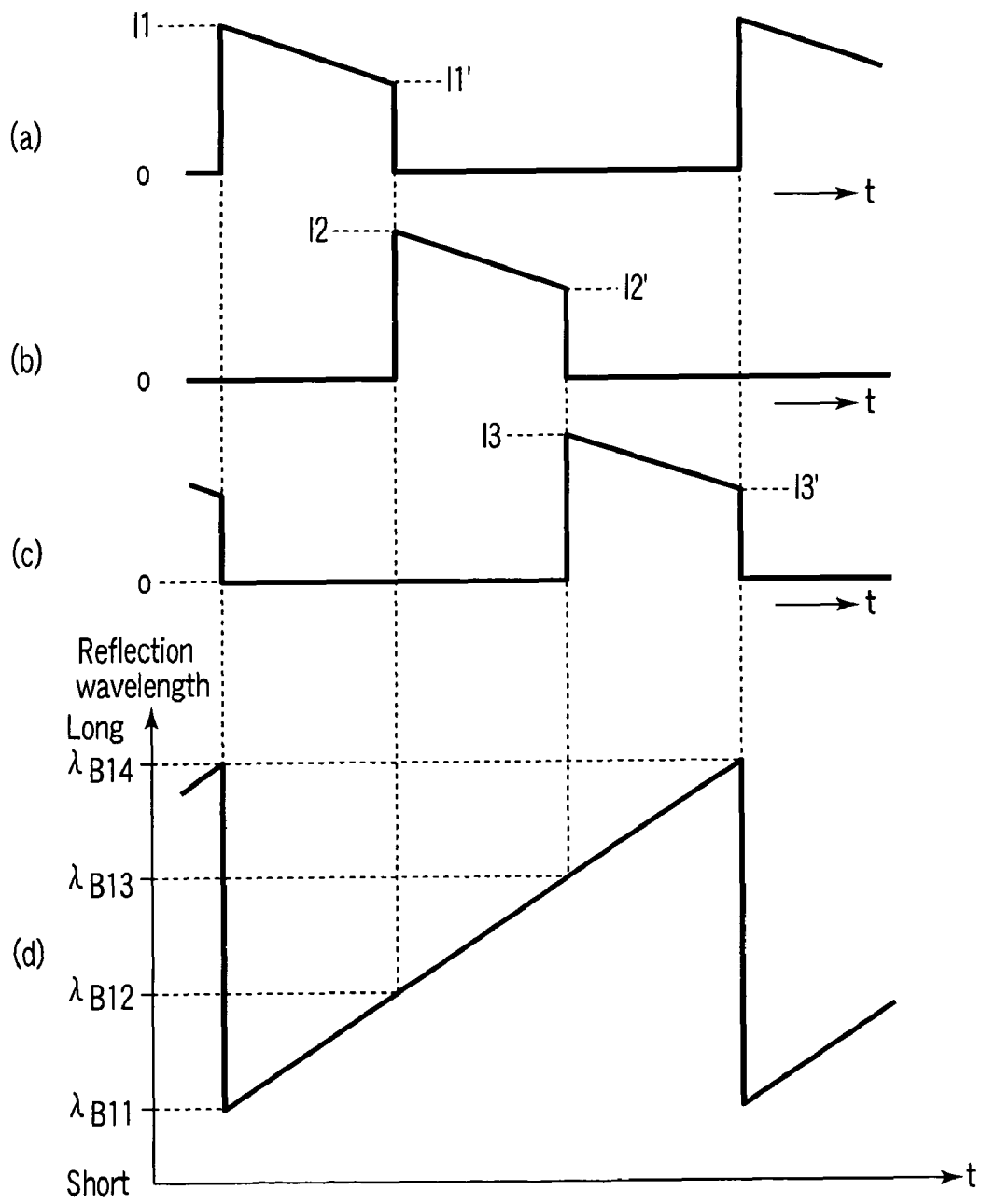
FIG. 7 is a relationship diagram between an injection current and a reflection wavelength in the case where the reflection wavelength is swept, and explains the operation of the semiconductor optical reflector (20) according to the first embodiment of the invention.

For instance, as shown in FIG. 7A, the electric current injected into the first individual electrode 41A is continuously changed from I1 to I1' to monotonically decrease the electric current density of the guide layer 24 (waveguide path), whereby the reflection wavelength is continuously changed from $\lambda_{B11}$ to $\lambda_{B12}$ as shown in FIG. 7D.

Subsequently, as shown in FIG. 7B, the electric current injected into the second individual electrode 41B is continuously changed from I2 to I2' to monotonically decrease the electric current density of the waveguide path, whereby the reflection wavelength is continuously changed from $\lambda_{B12}$ to $\lambda_{B13}$ as shown in FIG. 7D.

Further subsequently, as shown in FIG. 7C, the electric current injected into the third individual electrode 41C is continuously changed from I3 to I3' to monotonically decrease the electric current density of the guide layer 24 (the waveguide path), whereby the reflection wavelength is continuously changed from $\lambda_{B13}$ to $\lambda_{B14}$ as shown in FIG. 7D.

Note that the relations between the change in the injected electric current and the change in the reflection wavelength shown in FIGS. 7A, 7B, 7C and 7D are schematic.

As described above, the electric current block groups into which the electric current is injected are switched, and the injected electric current is varied, whereby, as a result, it is possible to sweep the reflection wavelength in a large range from $\lambda_{B11}$ to $\lambda_{B14}$ continuously and at high speed.

Figure 8:
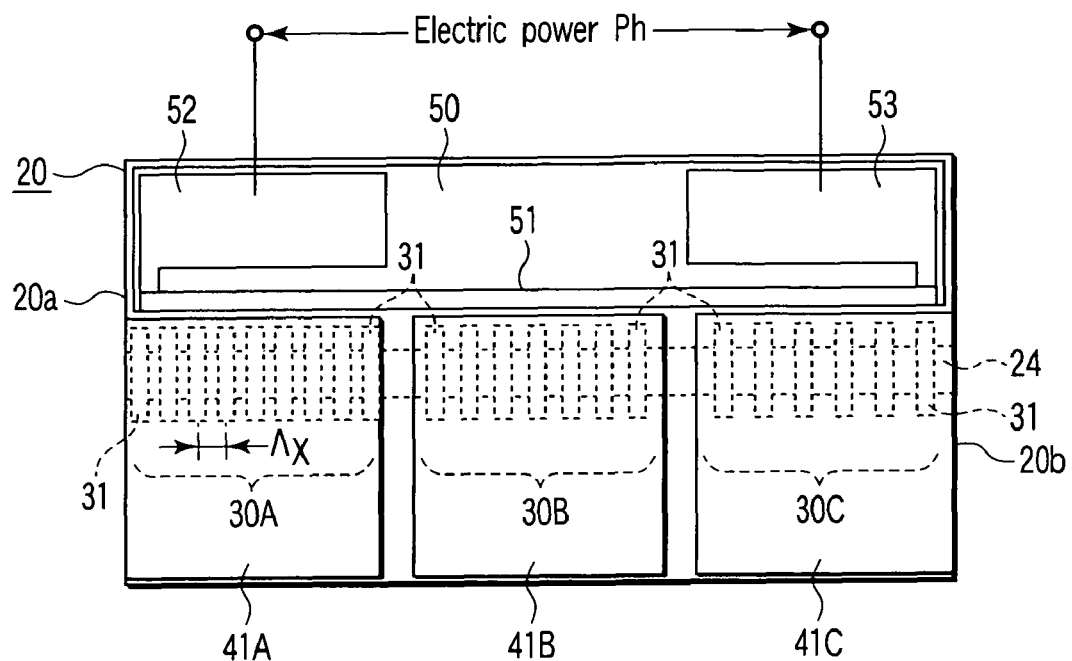
FIG. 8 is a plan view for explaining a structure provided with a heating element as a modification of the semiconductor optical reflector (20) according to the first embodiment of the invention.

As the semiconductor optical reflector 20 shown in FIG. 8, a heating element 51 and electrodes 52 and 53 may be formed on an insulating layer 50 provided on the upper surface side of the epitaxial wafer 21 (the surface side close to the guide layer 24).

In the semiconductor optical reflector 20 having the heating element 51, the electric power Ph given to the heating element 51 is changed through the electrodes 52 and 53 to change the temperature of the guide layer 24 (waveguide path), thereby making it possible to vary the reflection wavelength.

In addition, the temperature of the semiconductor optical reflector 20 containing the guide layer 24 is maintained at an extreme higher temperature (for example, 50° C.) than normal temperature due to the heat generation of the heating element 51, whereby it is possible to suppress the variation of the reflection wavelength occurring due to the change in the temperature around the semiconductor optical reflector 20.

Note that in the semiconductor optical reflector 20 shown in FIG. 8, the interval (pitch) $\Lambda x$ of the plurality of electric current regulating members 31 arranged along the guide layer 24 with a constant width is changed so as to be monotonically increased (or may be decreased).

The detailed description of this structure will be provided in the third embodiment to be described later.

In addition, in the semiconductor optical reflector 20 except the one shown in FIG. 8, the intervals $\Lambda 1$, $\Lambda 2$ and $\Lambda 3$ (where $\Lambda 1 < \Lambda 2 < \Lambda 3$ or $\Lambda 1 > \Lambda 2 > \Lambda 3$) of the plurality of electric current regulating members 31 are changed in a stepwise manner (three steps in this example) to the guide layer 24 having a constant width W over the total length of the semiconductor optical reflector 20, to provide the three individual electrodes 41A, 41B and 41C such that the electric current can be selectively injected in each of the regions having different intervals, whereby it is possible to change the reflection wavelength in at least three steps.

Figure 9:
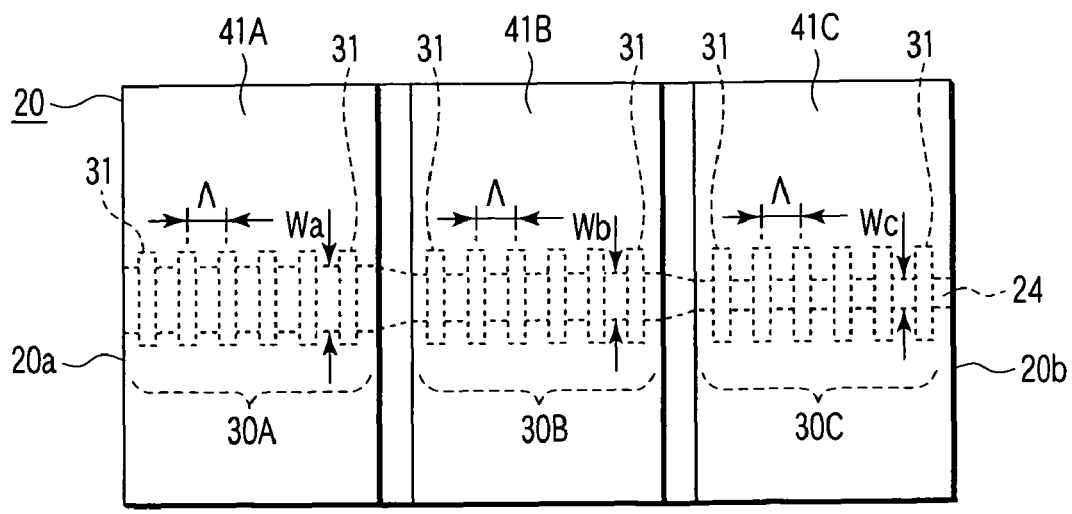
FIG. 9 is a plan view for explaining a structure in which a width of a guide layer is changed as a modification of the semiconductor optical reflector (20) according to the first embodiment of the invention.

As the semiconductor optical reflector 20 shown in FIG. 9, the reflection wavelength can be changed also by changing the width of the waveguide path, that is, the width W of the guide layer 24.

For instance, when the interval $\Lambda$ of the plurality of electric current regulating members 31 constituted of each of the electric current block groups 30A, 30B and 30C is rendered constant, the width of the guide layer 24 is changed in a stepwise manner (three steps in this example). The widths in the three steps are respectively represented by Wa, Wb and Wc (where Wa>Wb>Wc or Wa<Wb<Wc) so as to correspond to each of the electric current block groups 30A, 30B and 30C. Each of the individual electrodes 41A, 41B and 41C is arranged so that the electric current is selectively injected into each of regions having the different widths, whereby the stepwise variation of the reflection wavelength and the continuous sweeping thereof can be realized as in the above mentioned case.

In addition, as shown in the semiconductor laser of the second and subsequent embodiments to be described later, at least one of the interval of the plurality of electric current regulating members 31 and the width of the guide layer 24 is formed to monotonically change over the entire length of the semiconductor optical reflector 20, and the first and second electrodes 40 and 41 are formed such that the electric current can be selectively injected into each of regions having the different intervals of the plurality of electric current regulating members 31 and the different widths of the guide layer 24, whereby the stepwise variation and the continuous sweeping of the reflection wavelength can be realized.

The semiconductor optical reflector 20 having the above constitution can be used in various optical apparatuses in addition to the semiconductor laser in the second and subsequent embodiments.

For instance, as shown in FIGS. 7A, 7B, 7C and 7D, the semiconductor optical reflector 20 capable of continuously varying the reflection wavelength over a wide range can be used as a spectroscopy portion for an optical spectrum analyzer.

In addition, the semiconductor optical reflector 20 can be used as a variable wavelength light source by entering a broadband light to the one end side of the semiconductor optical reflector 20 and taking out the light, which has been reflected onto the one end side, in other light path different from the incident light path.

Note that in the semiconductor optical reflector 20 according to the first embodiment shown in FIG. 1A, the plurality of electric current regulating members 31 formed of an n-type semiconductor material or a high-resistance material are arranged in the inside of the p-type clad layer 22.

As shown in FIG. 1B, the first plurality of electric current regulating members 31 formed of the n-type semiconductor material or the high-resistance material may be arranged in the inside of the p-type clad layer 22, and at the same time, the second plurality of electric current regulating members 31 formed of a p-type semiconductor material or the high-resistance material may be arranged in a part close to the guide layer 24 in the n-type clad layer 23a, which is formed upward of the n-type substrate 23 and formed of, for example, n-type indium gallium arsenic phosphorous (n-InGaAsP), whereby the above mentioned electric current block groups 30A, 30B and 30C may be formed in both the first and second plurality of electric current regulating members 31.

The first and second plurality of electric current regulating members 31 respectively formed on the clad layers 22 and 23a may be provided to correspond to each of the electric current block groups 30A, 30B and 30C and arranged at the same pitch so as to respectively have the predetermined intervals $\Lambda 1$, $\Lambda 2$ and $\Lambda 3$.

In addition, a layer having an intermediate refractive index between the guide layer 24 and the clad layer may be formed in the vicinity of the guide layer 24 to make it possible to form the plurality of electric current regulating members 31 in the inside of the layer.

Note that the plurality of electric current regulating members 31 may be formed inside at least one of the p-type clad layer 22 and the n-type clad layer 23a.

(Second Embodiment)

Next, a semiconductor laser 60 according to the second embodiment of the invention will be described with reference to FIGS. 10 and 11.

Figure 10:
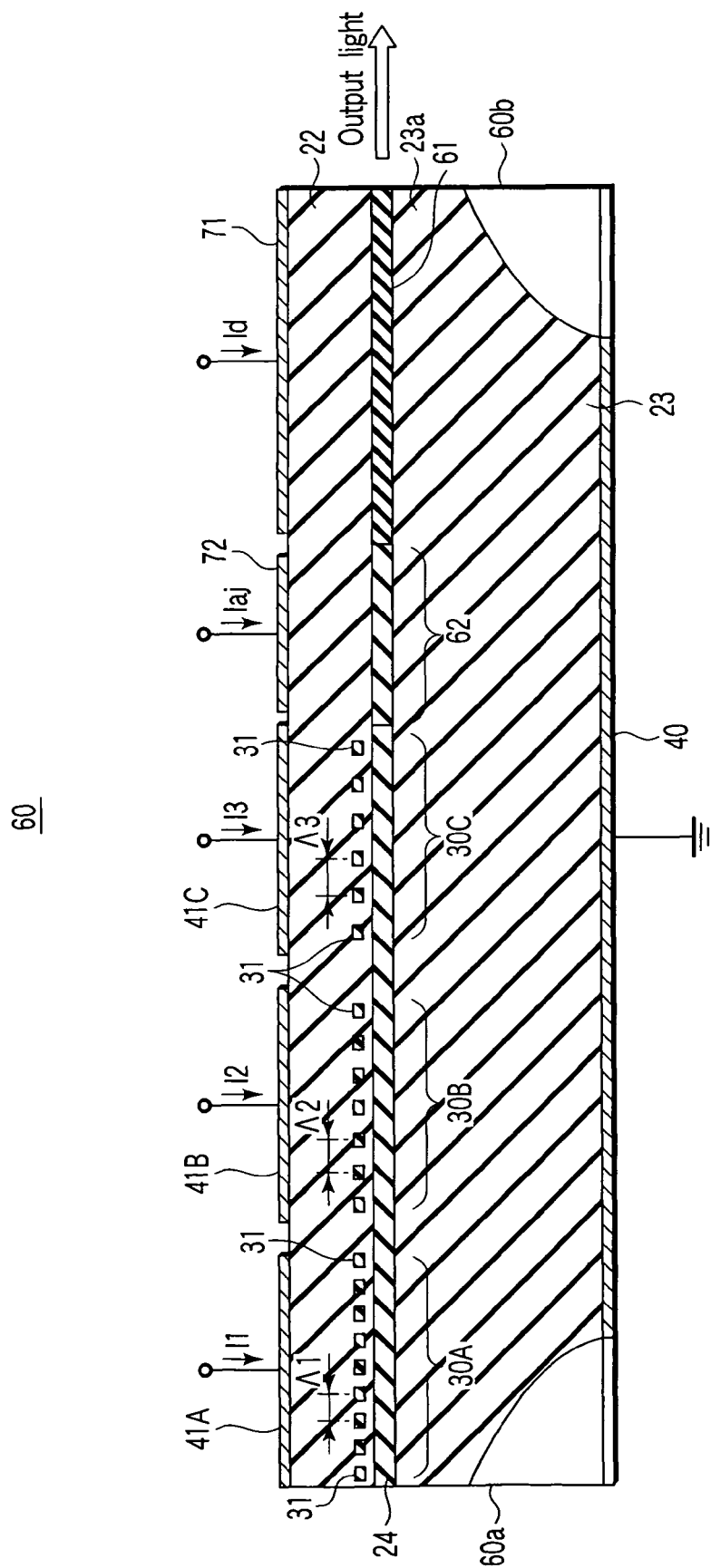
FIG. 10 is a sectional side view for explaining a structure of a semiconductor laser (60) according to a second embodiment of the invention.

FIG. 10 shows a case in which the semiconductor optical reflector 20 having the constitution according to the first embodiment is used as an optical reflector for the semiconductor laser 60 easy to be structurally integrated with the semiconductor optical reflector 20.

Referring to FIGS. 10 and 1A, in the basic structure of the semiconductor laser 60, an active layer 61 used for inducing and emitting a light is formed between a p-type clad layer 22 and an n-type clad layer 23a. The semiconductor optical reflector 20 which has the wavelength selectivity and reflects a light is provided on at least one end side of the active layer 61. In a semiconductor laser for selectively oscillating a light which has been induced and emitted in the active layer 61 and has a wavelength reflected by the semiconductor optical reflector 20, the semiconductor optical reflector 20 has an n-type substrate 23, an n-type clad layer 23a formed in a part of the n-type substrate 23 itself or upward of the n-type substrate 23, a p-type clad layer 22 formed upward of the n-type substrate 23, a guide layer 24, formed between the p-type clad layer 22 and the n-type clad layer 23a, for waveguiding a light, first and second electrodes 40 and 41 respectively formed on the bottom surface of the n-type substrate 23 and the upper surface of the p-type clad layer 22, and a plurality of electric current regulating members 31 provided in the vicinity of the guide layer 24 and regularly arranged along a light waveguide direction in the guide layer 24. The plurality of electric current regulating members 31 are characterized by showing a refractive index approximately the same as a surrounding object, providing an even electric current density distribution in the guide layer 24 along the light waveguide direction in the guide layer 24 in a state in which the electric current is injected in between the first and second electrodes 40 and 41, and generating an even refractive index distribution in the guide layer 24 along the light waveguide direction in the guide layer 24 based on the even electric current density distribution, whereby the guide layer 24 reflects a light with a wavelength, which is determined in accordance with the even refractive index distribution, of the incident lights.

Specifically, as shown in FIG. 10, the p-type clad layer 22, the n-type substrate (containing the clad layer) 23 and the common electrode 40 in the semiconductor optical reflector 20 with the above constitution are formed to extend to the one end side of the semiconductor laser 60.

The active layer 61 having a band gap for light emission and a phase adjustment region 62 constituted of a layer continuously formed in the guide layer 24 are formed between the extended p-type clad layer 22 and n-type substrate 23. An electrode 71 for excitation is provided on the upper surface side of the active layer 61, while an electrode 72 for phase adjustment is provided on the upper surface side of the phase adjustment region 62.

Note that the phase adjustment region 62 and the phase adjustment electrode 72 are used for adjusting the reflection wavelength of the guide layer 24 in portions corresponding to each of the electric current block groups 30A, 30B and 30C so as to be a resonant wavelength of a semiconductor laser element.

Therefore, the phase adjustment region 62 and the phase adjustment electrode 72 may be provided between the active layer 61 and an element end surface 60a, in addition to between the guide layer 24 and the active layer 61.

When the phase adjustment in an electric current for excitation is possible, the phase adjustment region 62 and the phase adjustment electrode 72 can be omitted.

In the semiconductor laser 60, when a predetermined electric current Id is injected into between the excitation electrode 71 and the common electrode 40, a light is emitted in the active layer 61, and thus a portion of the light enters the guide layer 24.

The above mentioned reflection wavelength of the guide layer 24 in portions corresponding to the first to third electric current block groups 30A, 30B and 30C, which constitute the plurality of electric current regulating members 31, is in a band region of the emitted light. Therefore, for instance, when a predetermined electric current I1 is injected from the first individual electrode 41A formed to correspond to the first electric current block group 30A, in the light entering from the active layer 61 to the guide layer 24 through the phase adjustment layer 62, the light with the wavelength $\lambda_{B1}$ is selectively reflected due to the electric current modulation action in the first electric current block group 30A.

Thereby, the light with the wavelength $\lambda_{B1}$ is repeatedly reflected and amplified between the element end surface 60a and the guide layer 24 in the vicinity of the first electric current block group 30A, and the portion of the light is output from an element end surface 60b for example.

Here, a phase adjustment electric current Iaj for realizing the output of the light having the reflection wavelength $\lambda_{B1}$ with the highest efficiency is injected into the phase adjustment electrode 72.

Likewise, when a predetermined electric current I2 is injected from the second individual electrode 41B formed to correspond to the second electric current block group 30B, a light with a wavelength $\lambda_{B2}$ is output due to the electric current modulation action in the second electric current block group 30B.

Likewise, when a predetermined electric current I3 is injected from the third individual electrode 41C formed to correspond to the third electric current block group 30C, a light with a wavelength $\lambda_{B3}$ is output due to the electric current modulation action in the third electric current block group 30C.

Meanwhile, when the electric current injection to each of the individual electrodes 41A, 41B and 41C is performed as in the manner shown in FIGS. 7A, 7B, 7C and 7D, it is possible to output the light of which the wavelength is continuously swept from $\lambda_{B11}$ to $\lambda_{B14}$.

However, in this case, the variable control of the phase adjustment electric current Iaj is also required.

Since the semiconductor optical reflector 20 according to the first embodiment of the invention which can realize the reflection of a plurality of wavelengths and has a high wavelength selectivity is used in the semiconductor laser 60 constituted as above, the semiconductor laser 60 can output a light which realizes a high spectral purity in an output light and has an extreme high quality in a simple structure.

The respective constitutions and modifications of the semiconductor optical reflector 20 as the semiconductor optical element shown in FIGS. 1A, 1B and 2 to 10 can be applied to the semiconductor laser 60 according to the second embodiment and the third to fifth embodiments to be described later.

Next, a method of manufacturing a basic structure of the semiconductor laser 60 will be described based on FIG. 11.

First, as shown in (a) of FIG. 11, a lower optical confinement layer 101 (hereinafter referred to as lower SCH (Separated Confinement Heterostructure) layer 101) formed of InGaAsP, an active layer 102 formed of InGaAsP, and an upper optical confinement layer 103 (hereinafter referred to as upper SCH layer 103) formed of InGaAsP are grown on an n-type InP substrate 100 by metalorganic vapor deposition (hereinafter referred to as "grown").

Note that the SCH layers 101 and 103, and the active layer 102 generally have a further multilayer internal structure.

Namely, the well-known structure such as a graded index SCH structure and a multiple quantum well active layer structure can be adopted as the multilayer internal structure, whereby the SCH layer may not be necessary.

InGaAs may be used in a quantum well layer in addition to InGaAsP, or a layer containing Al may be contained in the quantum well layer.

In this case, the composition of each layer can be suitably designed in accordance with the intended oscillation wavelength band.

Next, an $SiO_2$ film 104 is formed on the surface of the upper SCH layer 103, and then photo resist (hereinafter referred to as resist) is coated onto the entire surface, after which a photolithography process is performed such that the resist is remained only in a part which becomes an active region.

The exposed $SiO_2$ is removed by using a dry etching method such as a reactive ion etching or by using a wet etching method with hydrofluoric acid or the like, and subsequently, the upper SCH layer 101, the active layer 102 and the lower SCH layer 103 are partially removed by using the dry etching method or the wet etching method with sulfuric acid or the like, with use of the remaining $SiO_2$ film 104 as an etching mask.

FIG. 11(b) shows a state in which a residual resist is removed.

FIG. 11(c) shows a state in which a guide layer 105 formed of InGaAsP is grown on the exposed InP substrate 100 with the $SiO_2$ film 104 as a growth inhibition mask after the residual resist is removed, while the $SiO_2$ film 104 is removed by hydrofluoric acid.

Here, a band gap energy of the composition of InGaAsP in the guide layer 105 is larger than that of the composition of the active layer 102.

For instance, when the semiconductor laser has the wavelength of 1.55 μm, the composition of InGaAsP in the guide layer 105 is set in the range of 1.2 to 1.45 μm.

Subsequently, as shown in (d) of FIG. 11, a p-type InP spacer layer 106 and an n-type InP electric current block layer 107 are grown on the entire surface.

Note that the spacer layer 106 is integrated with a clad layer when the clad layer is grown later to become a part of the clad layer.

Next, a resist is coated on the entire surface, and thereafter, diffraction grating resists 108 are formed in a part to become a DBR region (electric current block group) by an electron beam drawing method or an interference exposure method. FIG. 11(e) shows that state.

Subsequently, the wet etching is performed by an etchant using a saturated bromine water or the like, and thus the plurality of electric current regulating members 31 constituted of the electric current block groups are etched in a diffraction grating shape.

In this case, the difference in an etching rate between n-type InP and p-type InP is very small, and therefore, time adjustment is performed such that the etching is stopped at an intermediate position of the spacer layer 106, as shown in (f) of FIG. 11.

FIG. 11(f) shows a state that the resist is removed after etching.

Subsequently, a p-type InP clad layer 106' is grown to cover the entire surfaces of the plurality of electric current regulating members 31.

Since the spacer layer 106 and the p-type InP clad layer 106' have the same composition, they are drawn to be integrated with each other in (f) of FIG. 11.

Although the detailed processes are omitted, the entirety of the basic structure of the semiconductor laser 60 is molded into a stripe-shaped mesa by photolithography and etching. The both sides of the mesa are buried with BH (Buried Heterostructure) layers 110 and 111 formed of p-type InP and n-type InP. A p-type InP upper clad layer 112 and a p-type InGaAs contact layer 113 are grown on the upper surface of the entirety, and thus the crystal growth process is completed.

Subsequently, when a p-type electrode 114 is formed on the p-type InGaAs contact layer 113, the electric current is separately injected into the active region and the DBR region, whereby the p-type electrode 114 is separated into plural portions.

In this case, in order to further enhance the separation resistance in the separation portion of the p-type electrode 114, it is preferable that the contact layer 113 in the separation portion be removed by etching.

Subsequently, the bottom surface of the n-type InP substrate 100 is polished to the thickness of about 100 μm by polishing, and thereafter, an n-type electrode 115 is formed on the polished surface.

FIGS. 11(h) and 11(i) respectively show a sectional side view and a front view of the structure of the semiconductor laser formed on an epitaxial wafer 21 by the above process.

In this case, the end surface of the semiconductor laser is formed by cleaving, and then coating with a dielectric multi-layer film is applied thereto according to need.

Note that in the above description, although the plurality of electric current regulating members 31 are the n-type semiconductor materials, they may be Fe-doped insulating InP (high-resistance material).

(Third Embodiment)

Next, a semiconductor laser 60 according to the third embodiment of the invention will be described with reference to FIG. 12.

The semiconductor laser 60 of the third embodiment, as shown also in FIG. 8, contains a chirped grating structure in which the interval (pitch) Λx of the plurality of electric current regulating members 31 arranged along the guide layer 24 with a constant width is changed (or continuously changed depending on a position) so as to be monotonically increased (or may be decreased).

Figure 12:
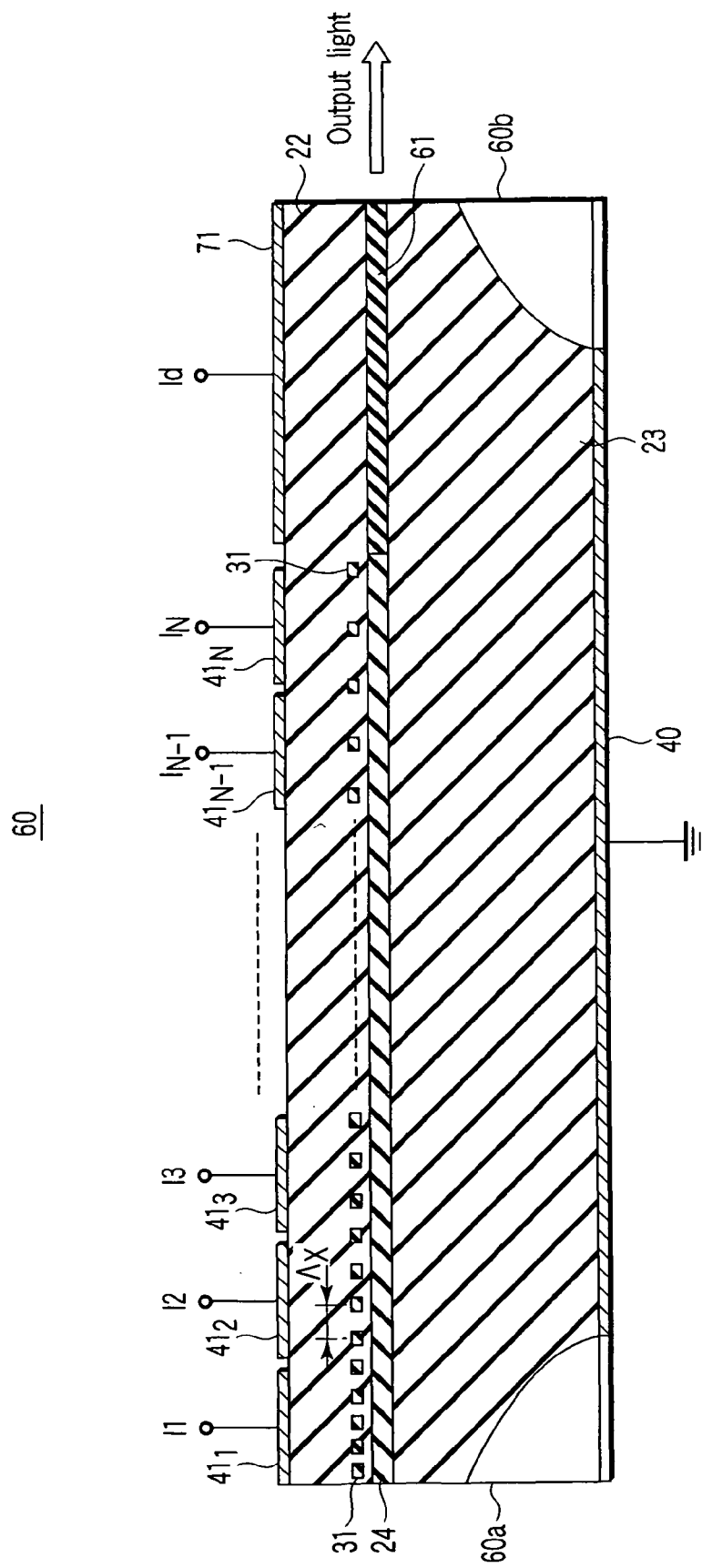
FIG. 12 is a sectional side view for explaining a structure of a semiconductor laser (60) according to a third embodiment of the invention.

In FIG. 12, the plurality of electric current regulating members 31 are sandwiched between a plurality of individual electrodes $41_1$, $41_2$, $41_3$, . . . , $41_{N-1}$ and $41_N$ (in FIG. 8, the individual electros 41A, 41B and 41C respectively corresponding to the electric current blocks 30A, 30B and 30C) and the common electrode 40. The individual electrodes are arranged at a constant interval (a phase control portion is omitted) such that the electric current can be independently injected into each region having the different interval in the plurality of electric current regulating members 31.

Electric currents I1, I2, I3, . . . , IN−1 and IN to be injected to each of the individual electrodes $41_1$, $41_2$, $41_3$, . . . , $41_{N-1}$ and $41_N$ are modulated, and then an appropriate phase difference is given between them, whereby it is possible to provide the semiconductor laser 60 capable of realizing the continuous wavelength sweeping operation at an extremely high speed.

Note that in the semiconductor laser 60 with the above constitution, the selection property in the reflection wavelength of each of the individual electrodes $41_1$, $41_2$, $41_3$, . . . , $41_{N-1}$ and $41_N$ is rather broader than that in the semiconductor layer 60 in which the plurality of electric current regulating members 31 are arranged at a constant interval, whereby the wavelength sweeping can be performed while maintaining the continuity of the wavelength.

In this embodiment, although the above constitution is applied to the semiconductor laser 60, it may also be applied to a single semiconductor optical reflector.

(Fourth Embodiment)

Figure 13:
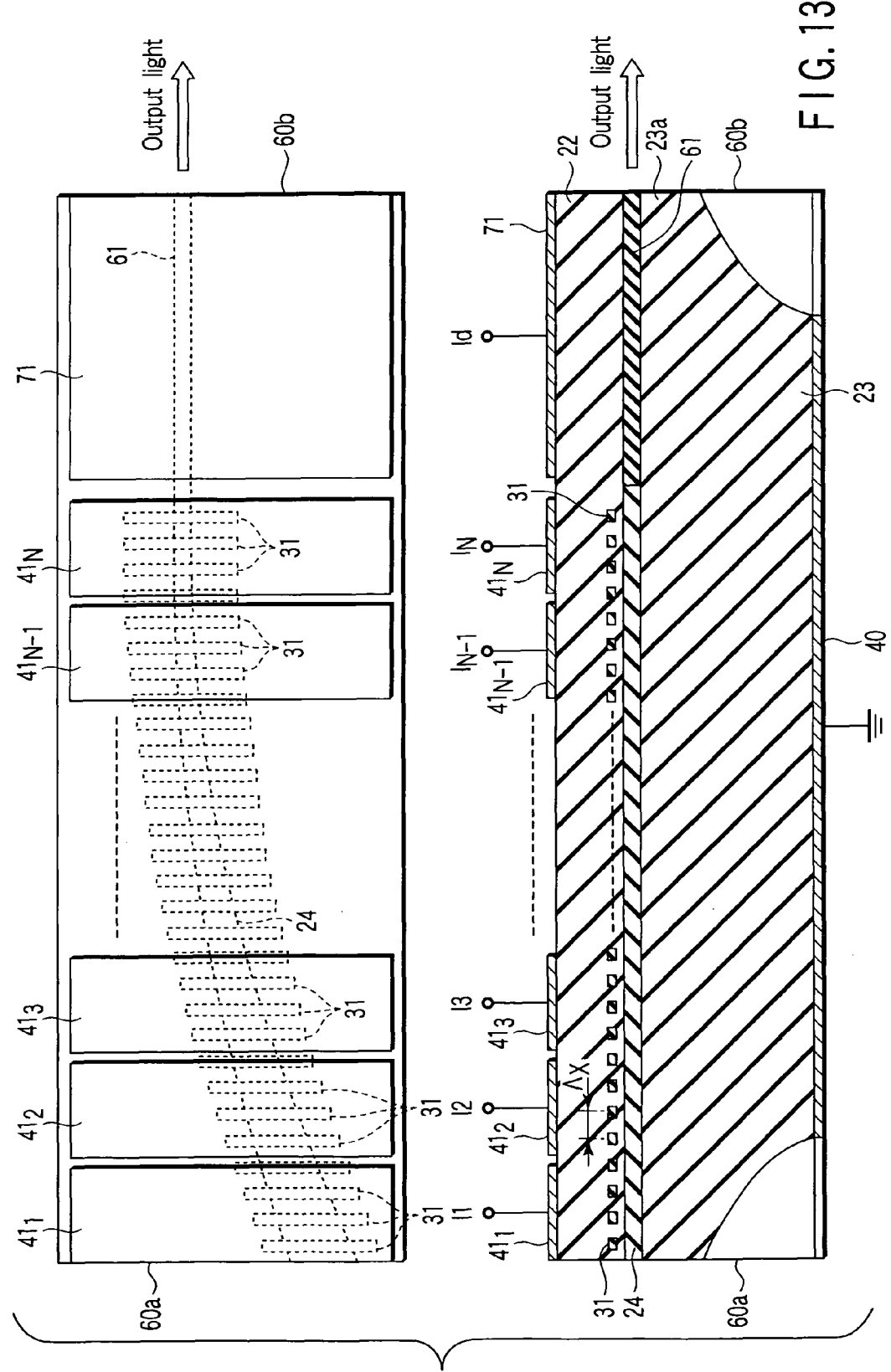
FIG. 13 is a plan view and a sectional side view for explaining a structure of a semiconductor laser (60) according to a forth embodiment of the invention.

Next, a semiconductor laser 60 according to the fourth embodiment of the invention will be described with reference to FIG. 13.

In the semiconductor laser 60 according to the third embodiment, the interval of the plurality of electric current regulating members 31 is changed so as to be monotonically increased (or may be decreased) whereby the continuous sweeping of the reflection wavelength is realized.

In contrast, in the semiconductor laser 60 according to the fourth embodiment, as shown in FIGS. 13A and 13B, the interval Λx of the plurality of electric current regulating members 31 is constant, and besides, the width of the guide layer 24 is gradually expanded (or may be reduced), whereby the effective chirped grating is provided.

Meanwhile, the guide layer 24 with a constant width is made to have a bent waveguide path structure whereby the chirped grating effect similar to the above can be obtained.

In this case, as shown in FIGS. 13A and 13B, the structure in which the width of the guide layer 24 is gradually expanded (or may be reduced) and the bent waveguide path structure are simultaneously provided whereby it is possible to realize the semiconductor laser 60 which can obtain a larger sweep width.

In addition, according to the semiconductor laser 60 with the above structure, the element end surface 60a is oblique to the guide layer 24, and therefore the end surface reflectance to the unnecessary light is lowered whereby more preferable spectrum property can be obtained.

(Fifth Embodiment)

Next, a semiconductor laser 60 according to the fifth embodiment of the invention will be described with reference to FIG. 14.

Figure 14:
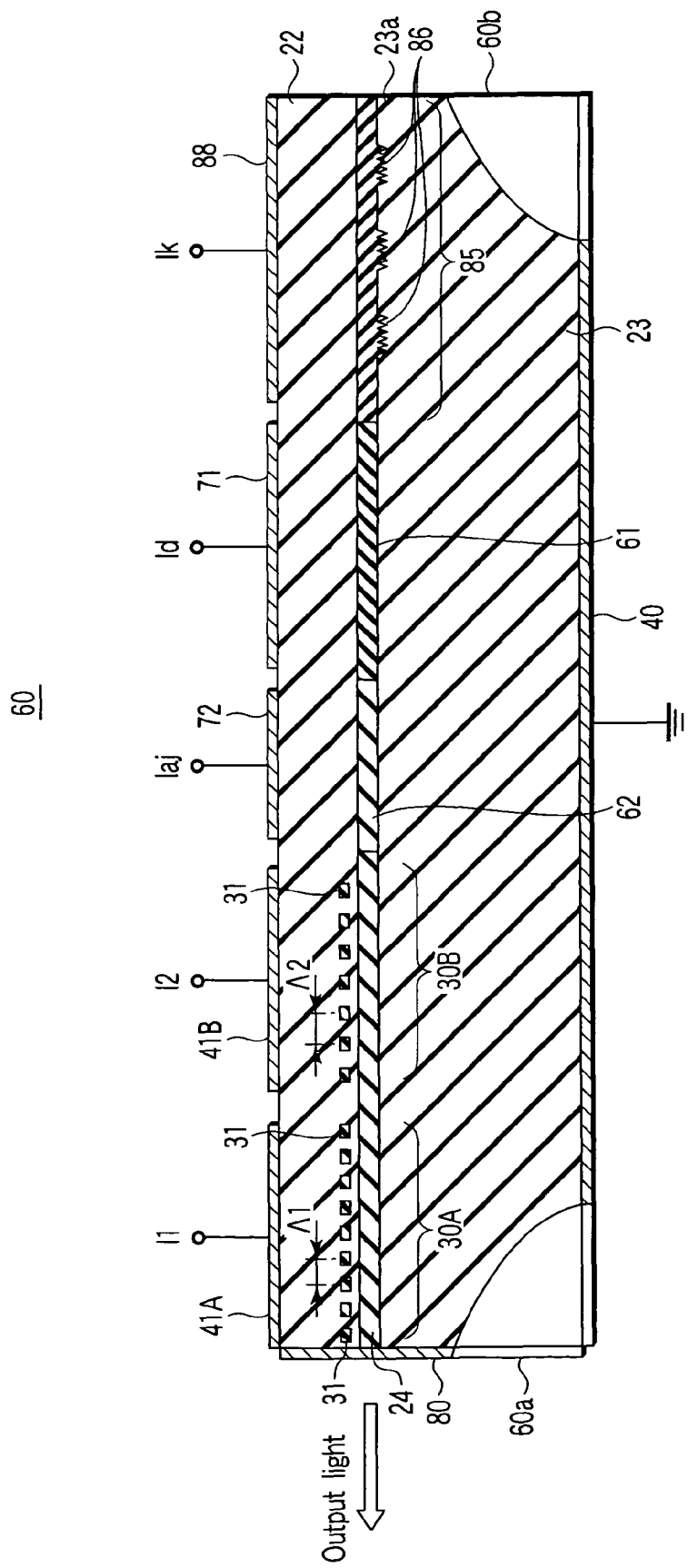
FIG. 14 is a sectional side view for explaining a structure of a semiconductor laser (60) according to a fifth embodiment of the invention.

As in the laser oscillator described in the Patent Document 1, in the semiconductor laser 60 according to the fifth embodiment shown in FIG. 14, the sampled grating structure (in which a plurality of pairs of grating portions 86 are arranged at a predetermined interval, wherein reflection is performed with a plurality of wavelengths determined by the intervals of the grating portions 86 and their grooves) is used as a DBR region 85 on the rear side of the active layer 61. An electrode 88 for injecting an electric current Ik is provided in the DBR region 85.

The above structure is effective only in the case where the wavelength selectivity is insufficient only by the electric current modulation action performed by the plurality of electric current regulating members 31 on the front side. The semiconductor laser 60 having a high wavelength selectivity can be realized by selecting only an arbitrary Bragg wavelength from among the plurality of Bragg wavelengths, selected by the DBR region 85 in the rear side, by any of the electric current block groups 30A and 30B on the front side (the number of the electric current block groups may not be two, but may be one, or three or more).

Note that in this semiconductor laser 60, an AR coat 80 provided in the element end surface 60a on the guide layer 24 side is a light output end surface.

Figure 15:
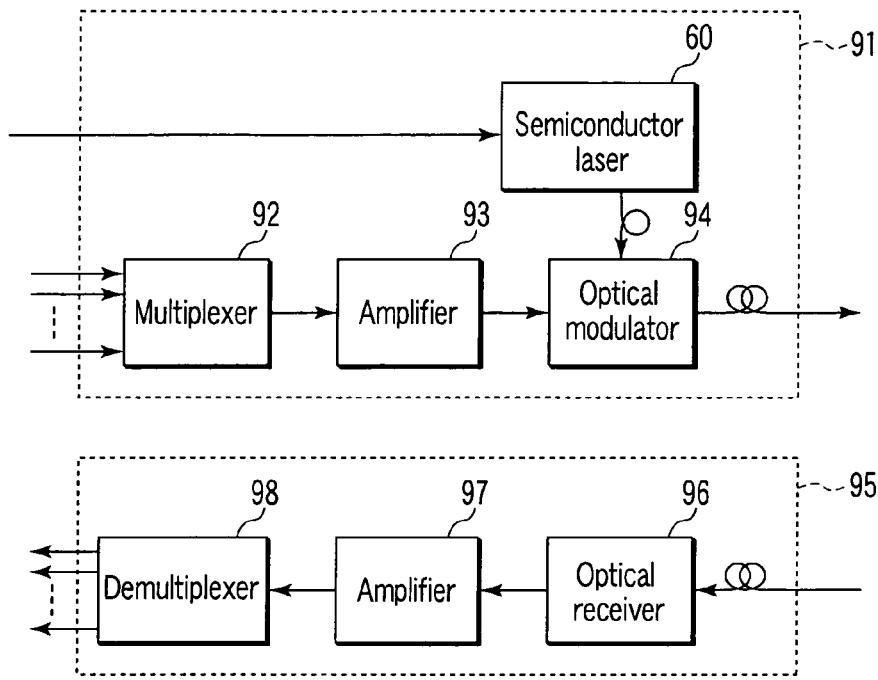
FIG. 15 is a block diagram for explaining a structure of an optical transponder (90) according to a sixth embodiment of the invention.
Figure 16:
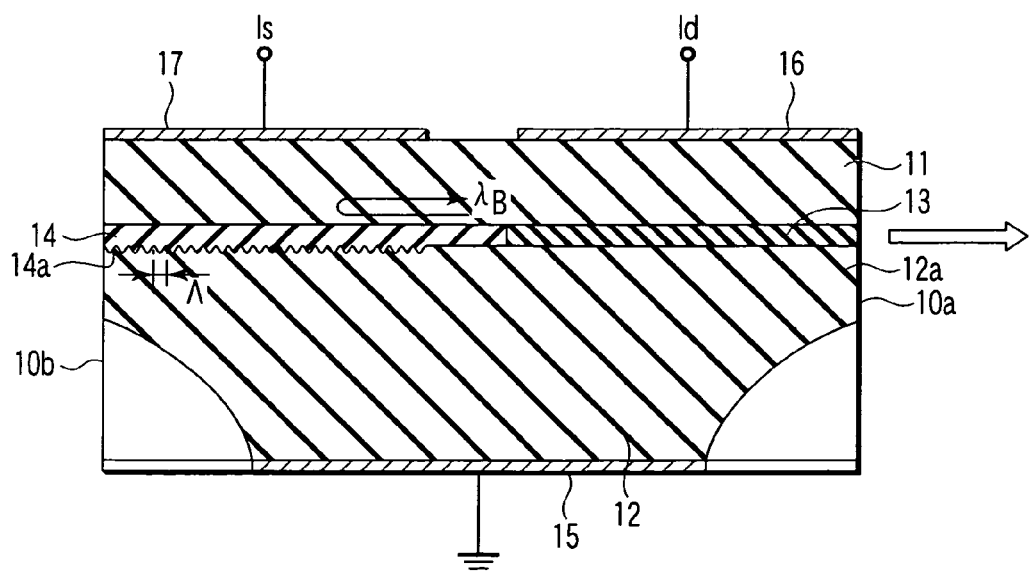
FIG. 16 is a sectional side view for explaining a structure of a DBR type semiconductor laser according to the prior art.

The semiconductor laser 60 of each embodiment described above can be used for a transmission section 91 of an optical transponder 90 shown in FIG. 15.

(Sixth Embodiment)

Next, the optical transponder 90 according to the six embodiment of the invention in which the semiconductor laser 60 of each embodiment described above is used for the transmission section 91 will be described with reference to FIG. 15.

A basic structure of the optical transponder 90 will be described with reference to FIGS. 1A and 10 in addition to FIG. 15. In the optical transponder 90 having the transmission section 91 for modulating an output light of the wavelength variable type semiconductor laser 60 by an electrical signal to output the light, and a receiving section 95 for converting an incident light into the electrical signal to output it, the semiconductor laser 60 of the transmission section 91 has a constitution in which the active layer 61 for inducing and emitting a light is formed between the p-type clad layer 22 and the n-type clad layer 23, and the semiconductor optical reflector 20 which has the wavelength selectivity and reflects a light is provided on at least one end side of the active layer 61. The semiconductor laser 60 selectively oscillates a light which has been induced and emitted in the active layer 61 and has a wavelength reflected by the semiconductor optical reflector 20. The semiconductor optical reflector 20 in the semiconductor laser 60 has the n-type substrate 23, the n-type clad layer 23a formed in a part of the n-type substrate 23 itself or upward of the n-type substrate 23, the p-type clad layer 22 formed upward of the n-type substrate 23, the guide layer 24, formed between the p-type clad layer 22 and the n-type clad layer 23a, for waveguiding a light, first and second electrodes 40 and 41 respectively formed on the bottom surface of the n-type substrate 23 and the upper surface of the p-type clad layer 22, and the plurality of electric current regulating members 31 provided in the vicinity of the guide layer 24 and regularly arranged along a light waveguide direction in the guide layer 24. The plurality of electric current regulating members 31 are characterized by showing a refractive index approximately the same as a surrounding object, providing an even electric current density distribution in the guide layer 24 along the light waveguide direction in the guide layer 24 in a state in which the electric current has been injected in between the first and second electrodes 40 and 41, and generating an even refractive index distribution in the guide layer 24 along the light waveguide direction in the guide layer 24 based on the even electric current density distribution, whereby the guide layer 24 reflects a light with a wavelength, which is determined in accordance with the even refractive index distribution, of the incident lights.

Specifically, the optical transponder 90 according to the sixth embodiment of the invention is constituted of the transmission section 91 and the receiving section 95, as shown in FIG. 15.

The transmission section 91 of the optical transponder 90 multiplexes electrical signals of a plurality of channels through a multiplexer 92 to input the multiplexed electrical signal to an optical modulator 94 through an amplifier 93.

The optical modulator 94 modulates intensity of the output light of the wavelength variable type semiconductor laser 60 by the multiplexed electric signal to output the intensity-modulated output light to an external optical network or the like.

In this case, the semiconductor laser 60 according to the second to fifth embodiments is used, and besides, the semiconductor optical reflector 20 as the semiconductor optical element in the first embodiment is used in the semiconductor laser 60.

Note that the output light wavelength of the semiconductor laser 60 is variably controlled by a controller (not shown).

Meanwhile, the receiving section 95 of the optical transponder 90 converts a multiplexed optical signal entering from the external optical network or the like into the electrical signal in an optical receiver 96 to input the electrical signal into a demultiplexer 98 through an amplifier 97, and thus the demultiplexer 98 separates the electric signal into electric signals of a plurality of channels to output them.

The output wavelength of the semiconductor laser 60 with the high wavelength selectivity is variably controlled as described above, whereby the optical transponder 90 having the above constitution can easily correspond to the optical network for giving and receiving a multiwavelength optical signal.

The constitution and modification in the semiconductor optical reflector as the semiconductor optical element shown in FIGS. 1B, 2 to 9, and 11 to 14 in addition to FIGS. 1A and 10 and those in the semiconductor laser 60 using this semiconductor optical reflector can be applied to the semiconductor laser 60 used in the transmission section 91 of the optical transponder 90 according to the sixth embodiment.

In the invention, the plurality of electric current regulating members 31 are provided in the vicinity of the guide layer 24 and regularly arranged along the light waveguide direction of the guide layer 24. Namely, the electric current block groups 30A, 30B and 30C constituting the plurality of electric current regulating members 31 are regularly arranged at each of the predetermined intervals $\Lambda 1$, $\Lambda 2$ and $\Lambda 3$ (where $\Lambda 1 < \Lambda 2 < \Lambda 3$ or $\Lambda 1 > \Lambda 2 > \Lambda 3$) as shown in FIGS. 1A, 1B, 2 and 10. However, the invention is not limited to such an arrangement. The plurality of electric current regulating members 31 are substantially regularly arranged, and therefore, they may be arranged at the constant intervals $\Lambda$ and $\Lambda x$ as shown in FIGS. 9 and 13B, or may be regularly arranged with a pitch of the interval $\Lambda x$ (the interval may be continuously changed depending on a position) monotonically increased (or may be decreased) as shown in FIGS. 8 and 12.

Therefore, as described above in detail, according to the invention, in a semiconductor optical reflector having a wavelength selectivity to a reflected wave, it is possible to provide a semiconductor optical reflector as a semiconductor optical element adopting a technique for realization of transition from a non-reflective state to a state in which only a light with a target wavelength is reflected with a high wavelength selectivity, a semiconductor laser using the semiconductor optical reflector, and an optical transponder using the semiconductor laser.

The invention claimed is:

1. A semiconductor optical reflector comprising:
an n-type substrate;
an n-type clad layer formed as a part of the n-type substrate itself or upward of the n-type substrate;
a p-type clad layer formed upward of the n-type substrate;
a guide layer which is formed between the p-type clad layer and the n-type clad layer, and which waveguides light;
first and second electrodes respectively formed on a bottom surface of the n-type substrate and an upper surface of the p-type clad layer, wherein one of the first and second electrodes is formed as a common electrode and the other of the first and second electrodes is formed as a plurality of individual electrodes;
a plurality of electric current regulating members which are provided in a vicinity of the guide layer and which are regularly arranged along a light waveguide direction of the guide layer,
wherein the plurality of electric current regulating members: (i) show a refractive index approximately the same as a surrounding object, (ii) provide an even electric current density distribution in the guide layer along the light waveguide direction in a state in which an electric current has been injected between the first and second electrodes, and (iii) generate an even distribution of the refractive index in the guide layer along the light waveguide direction based on the even electric current density distribution, and
wherein the plurality of electric current regulating members are formed as at least two electric current block groups having respectively predetermined intervals respectively corresponding to the plurality of individual electrodes; and a heating element which extends in the light waveguide direction of the guide layer along the at least two electric current block groups to vary a temperature of the guide layer,
wherein the guide layer reflects light with a given wavelength, which is determined in accordance with the even refractive index distribution, from incident light,
wherein the plurality of electric current regulating members show:
a first reflection property having a peak reflectance at a wavelength $\lambda_{B1}$ satisfying a Bragg reflection condition: $\lambda_{B1} = 2n_1 \Lambda 1$ (wherein, $n_1$ is an equivalent refractive index of a waveguide path) in a state in which an electric current has been injected into the common electrode and into a first one of the plurality of individual electrodes corresponding to a first one of the at least two electric current block groups which has the predetermined interval $\Lambda 1$ between plural electric current regulating members; and
a second reflection property having the peak reflectance at a wavelength $\lambda_{B2}$ satisfying a Bragg reflection condition: $\lambda_{B2} = 2n_2 \Lambda 2$ (wherein, $n_2$ is the equivalent refractive index of the waveguide path) in a state in which an electric current has been injected into the common electrode and into a second one of the plurality of individual electrodes corresponding to a second one of the at least two electric current block groups which has the predetermined interval $\Lambda 2$ between plural electric current regulating members, and
wherein one or both of the first and second reflection properties can be arbitrarily selected.

2. The semiconductor optical reflector according to claim 1, wherein the plurality of electric current regulating members are formed inside at least one of the p-type clad layer and the n-type clad layer.

3. The semiconductor optical reflector according to claim 2, wherein the plurality of electric current regulating members have a conductivity type opposite to that of the surrounding clad layer.

4. The semiconductor optical reflector according to claim 1, wherein the plurality of electric current regulating members are formed of a high-resistance material.

5. A semiconductor laser comprising:
an active layer which is formed between a p-type clad layer and an n-type clad layer to induce and emit light, and
a semiconductor optical reflector which has wavelength selectivity, which reflects light, and which is provided on at least one end side of the active layer,
wherein the semiconductor laser selectively oscillates light which has been induced and emitted by the active layer and which has a wavelength that is reflected by the semiconductor optical reflector, and
wherein the semiconductor optical reflector comprises:
an n-type substrate;
the n-type clad layer which is formed as a part of the n-type substrate itself or upward of the n-type substrate;
the p-type clad layer which is formed upward of the n-type substrate;

a guide layer which is formed between the p-type clad layer and the n-type clad layer and which waveguides light;

first and second electrodes respectively formed on a bottom surface of the n-type substrate and an upper surface of the p-type clad layer; and a plurality of electric current regulating members which are provided in a vicinity of the guide layer and which are regularly arranged along a light waveguide direction of the guide layer, wherein the plurality of electric current regulating members: (i) show a refractive index approximately the same as a surrounding object, (ii) provide an even electric current density distribution in the guide layer along the light waveguide direction in a state in which an electric current has been injected between the first and second electrodes, and (iii) generate an even distribution of the refractive index in the guide layer along the light waveguide direction based on the even electric current density distribution, wherein the guide layer reflects light with a given wavelength, which is determined in accordance with the even refractive index distribution, from incident light, wherein the semiconductor optical reflector is formed such that an interval between the plurality of the electric current regulating members is monotonically increased or decreased along the light waveguide direction of the guide layer, and wherein one of the first and second electrodes is formed as a common electrode and the other of the first and second electrodes is formed as a plurality of individual electrodes, so as to selectively inject the electric current in each region where the interval between the plurality of electric current regulating members is monotonically increased or decreased.

6. The semiconductor laser according to claim 5, wherein the plurality of electric current regulating members of the semiconductor optical reflector are formed inside at least one of the p-type clad layer and the n-type clad layer.

7. The semiconductor laser according to claim 6, wherein the plurality of electric current regulating members of the semiconductor optical reflector have a conductivity type opposite to that of the surrounding clad layer.

8. The semiconductor laser according to claim 5, wherein the plurality of electric current regulating members of the semiconductor optical reflector are formed of a high-resistance material.

9. An optical transponder comprising:

a transmission section which modulates an output light of a wavelength variable type semiconductor laser by an electrical signal to output the modulated light; and a receiving section which converts an incident light into an electrical signal, and outputs the electrical signal, wherein the semiconductor laser of the transmission section comprises: (i) an active layer which is formed between a p-type clad layer and an n-type clad layer to induce and emit light, (ii) a semiconductor optical reflector which has wavelength selectivity, which reflects light, and which is provided on at least one end side of the active layer, and (iii) a DBR region having a sampled grating structure which is formed on a rear side of the active laver, wherein the semiconductor laser selectively oscillates light which has been induced and emitted by the active layer, and which has a wavelength that is reflected by the semiconductor optical reflector and the DBR region, and wherein the semiconductor optical reflector of the semiconductor laser comprises:

an n-type substrate;

the n-type clad layer which is formed as a part of the n-type substrate itself or upward of the n-type substrate;

the p-type clad layer which is formed upward of the n-type substrate;

a guide layer which is formed between the p-type clad layer and the n-type clad layer and which waveguides light;

first and second electrodes respectively formed on a bottom surface of the n-type substrate and an upper surface of the p-type clad layer, wherein one of the first and second electrodes is formed as a common electrode and the other of the first and second electrodes is formed as a plurality of individual electrodes; and a plurality of electric current regulating members which are provided in a vicinity of the guide layer and which are regularly arranged along a light waveguide direction of the guide layer, wherein the plurality of electric current regulating members: (i) show a refractive index approximately the same as a surrounding object, (ii) provide an even electric current density distribution in the guide layer along the light waveguide direction in a state in which an electric current has been injected between the first and second electrodes, and (iii) generate an even distribution of the refractive index in the guide layer along the light waveguide direction based on the even electric current density distribution, wherein the guide layer reflects light with a given wavelength, which is determined in accordance with the even refractive index distribution, from incident light, wherein the plurality of electric current regulating members are formed as at least two electric current block groups having respectively predetermined intervals respectively corresponding to the plurality of individual electrodes, wherein the plurality of electric current regulating members show:

a first reflection property having a peak reflectance at a wavelength $\lambda_{B1}$ satisfying a Bragg reflection condition: $\lambda_{B1}=2n_1\Lambda1$ (wherein, $n_1$ is an equivalent refractive index of a waveguide path) in a state in which an electric current has been injected into the common electrode and into a first one of the plurality of individual electrodes corresponding to a first one of the at least two electric current block groups which has the predetermined interval $\Lambda1$ between plural electric current regulating members; and a second reflection property having the peak reflectance at a wavelength $\lambda_{B2}$ satisfying a Bragg reflection condition: $\lambda_{B2}=2n_2\Lambda2$ (wherein, $n_2$ is the equivalent refractive index of the waveguide path) in a state in which an electric current has been injected into the common electrode and into a second one of the plurality of individual electrodes corresponding to a second one of the at least two electric current block groups which has the predetermined interval $\Lambda2$ between plural electric current regulating members, and wherein one or both of the first and second reflection properties can be arbitrarily selected.

10. A semiconductor laser comprising:
an active layer which is formed between a p-type clad layer and an n-type clad layer to induce and emit light, and
a semiconductor optical reflector which has wavelength selectivity, which reflects light, and which is provided on at least one end side of the active layer,
wherein the semiconductor laser selectively oscillates light which has been induced and emitted by the active layer and which has a wavelength that is reflected by the semiconductor optical reflector, and
wherein the semiconductor optical reflector comprises:
an n-type substrate;
the n-type clad layer which is formed as a part of the n-type substrate itself or upward of the n-type substrate;
the p-type clad layer which is formed upward of the n-type substrate;
a guide layer which is formed between the p-type clad layer and the n-type clad layer and which waveguides light;
first and second electrodes respectively formed on a bottom surface of the n-type substrate and an upper surface of the p-type clad layer; and
a plurality of electric current regulating members which are provided in a vicinity of the guide layer and which are regularly arranged along a light waveguide direction of the guide layer,
wherein the plurality of electric current regulating members: (i) show a refractive index approximately the same as a surrounding object, (ii) provide an even electric current density distribution in the guide layer along the light waveguide direction in a state in which an electric current has been injected between the first and second electrodes, and (iii) generate an even distribution of the refractive index in the guide layer along the light waveguide direction based on the even electric current density distribution,
wherein the guide layer reflects light with a given wavelength, which is determined in accordance with the even refractive index distribution, from incident light,
wherein the semiconductor optical reflector is formed such that an interval between the plurality of the electric current regulating members is constant, and a width of the guide layer is gradually expanded or reduced along the light waveguide direction of the guide layer, and
wherein one of the first and second electrodes is formed as a common electrode and the other of the first and second electrodes is formed as a plurality of individual electrodes, so as to selectively inject the electric current in each region where the width of the guide layer is gradually expanded or reduced.

11. The semiconductor laser according to claim 10, wherein the guide layer has a bent waveguide path structure in which the guide layer intersects with one end surface of the semiconductor laser at an oblique angle.

12. The semiconductor laser according to claim 10, wherein the plurality of electric current regulating members of the semiconductor optical reflector are formed inside at least one of the p-type clad layer and the n-type clad layer.

13. The semiconductor laser according to claim 12, wherein the plurality of electric current regulating members of the semiconductor optical reflector have a conductivity type opposite to that of the surrounding clad layer.

14. The semiconductor laser according to claim 10, wherein the plurality of electric current regulating members of the semiconductor optical reflector are formed of a high-resistance material.

15. A semiconductor laser comprising:
an active layer which is formed between a p-type clad layer and an n-type clad layer to induce and emit light,
a semiconductor optical reflector which has wavelength selectivity, which reflects light, and which is provided on one end side of the active layer, and
a DBR region having a sampled grating structure which is formed on a rear side of the active layer,
wherein the semiconductor laser selectively oscillates light which has been induced and emitted by the active layer, and which has a wavelength that is reflected by the semiconductor optical reflector and the DBR region, and
wherein the semiconductor optical reflector comprises:
an n-type substrate;
the n-type clad layer which is formed as a part of the n-type substrate itself or upward of the n-type substrate;
the p-type clad layer which is formed upward of the n-type substrate;
a guide layer which is formed between the p-type clad layer and the n-type clad layer and which waveguides light;
first and second electrodes respectively formed on a bottom surface of the n-type substrate and an upper surface of the p-type clad layer, wherein one of the first and second electrodes is formed as a common electrode and the other of the first and second electrodes is formed as a plurality of individual electrodes; and
a plurality of electric current regulating members which are provided in a vicinity of the guide layer and which are regularly arranged along a light waveguide direction of the guide layer,
wherein the plurality of electric current regulating members: (i) show a refractive index approximately the same as a surrounding object, (ii) provide an even electric current density distribution in the guide layer along the light waveguide direction in a state in which an electric current has been injected between the first and second electrodes, and (iii) generate an even distribution of the refractive index in the guide layer along the light waveguide direction based on the even electric current density distribution,
wherein the plurality of electric current regulating members are formed as at least two electric current block groups having respectively predetermined intervals respectively corresponding to the plurality of individual electrodes,
wherein the guide layer reflects light with a given wavelength, which is determined in accordance with the even refractive index distribution, from incident light,
wherein the plurality of electric current regulating members show:
a first reflection property having a peak reflectance at a wavelength $\lambda_{B1}$ satisfying a Bragg reflection condition: $\lambda_{B1} = 2n_1 \Lambda 1$ (wherein, $n_1$ is an equivalent refractive index of a waveguide path) in a state in which an electric current has been injected into the common electrode and into a first one of the plurality of individual electrodes corresponding to a first one of the at least two electric current block groups which has the predetermined interval $\Lambda 1$ between plural electric current regulating members; and a second reflection property having the peak reflectance at a wavelength $\lambda_{B2}$ satisfying a Bragg reflection condition: $\lambda_{B2}=2n_2\Lambda 2$ (wherein, $n_2$ is the equivalent refractive index of the waveguide path) in a state in which an electric current has been injected into the common electrode and into a second one of the plurality of individual electrodes corresponding to a second one of the at least two electric current block groups which has the predetermined interval $\Lambda 2$ between plural electric current regulating members, and wherein one or both of the first and second reflection properties can be arbitrarily selected.

16. The semiconductor laser according to claim 15, wherein the plurality of electric current regulating members of the semiconductor optical reflector are formed inside at least one of the p-type clad layer and the n-type clad layer.

17. The semiconductor laser according to claim 16, wherein the plurality of electric current regulating members of the semiconductor optical reflector have a conductivity type opposite to that of the surrounding clad layer.

18. The semiconductor laser according to claim 15, wherein the plurality of electric current regulating members of the semiconductor optical reflector are formed of a high-resistance material.

* * * * *